(12) United States Patent
Sills et al.

(10) Patent No.: US 8,530,939 B2
(45) Date of Patent: *Sep. 10, 2013

(54) CROSS-POINT MEMORY STRUCTURES

(75) Inventors: Scott Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/484,944

(22) Filed: May 31, 2012

(65) Prior Publication Data

US 2012/0235211 A1 Sep. 20, 2012

Related U.S. Application Data

(60) Continuation of application No. 13/213,718, filed on Aug. 19, 2011, now Pat. No. 8,207,557, which is a division of application No. 12/389,142, filed on Feb. 19, 2009, now Pat. No. 8,021,897.

(51) Int. Cl.
*H01L 23/52* (2006.01)
*H01L 21/82* (2006.01)

(52) U.S. Cl.
USPC .......... 257/211; 257/296; 257/E29.17; 438/3; 438/129

(58) Field of Classification Search
None
See application file for complete search history.

(56) References Cited

U.S. PATENT DOCUMENTS

| | | |
|---|---|---|
| 5,497,017 A | 3/1996 | Gonzales |
| 5,835,396 A | 11/1998 | Zhang |
| 6,269,018 B1 | 7/2001 | Monsma et al. |
| 6,627,530 B2 | 9/2003 | Li et al. |
| 6,642,603 B1 | 11/2003 | Knall |
| 6,716,644 B2 | 4/2004 | Nejad et al. |
| 6,743,641 B2 | 6/2004 | Yates et al. |
| 6,750,069 B2 | 6/2004 | Durcan et al. |
| 6,780,652 B2 | 8/2004 | Lee |
| 6,781,166 B2 | 8/2004 | Lieber et al. |

(Continued)

FOREIGN PATENT DOCUMENTS

| | | |
|---|---|---|
| TW | 200723508 | 6/2007 |
| TW | 200733353 | 9/2007 |

(Continued)

OTHER PUBLICATIONS de Graaf et al., "A Novel High-Density Low-Cost Diode Programmable Read Only Memory", IEEE, 1996, pp. 7.6.1-7.6.4.

*Primary Examiner* — Alonzo Chambliss
(74) *Attorney, Agent, or Firm* — Wells St. John P.S.

(57) ABSTRACT

Some embodiments include cross-point memory structures. The structures may include a line of first electrode material extending along a first horizontal direction, a multi-sided container of access device materials over the first electrode material, a memory element material within the multi-sided container, and a line of second electrode material over the memory element material and extending along a second horizontal direction that is orthogonal to the first horizontal direction. Some embodiments include methods of forming memory arrays. The methods may include forming a memory cell stack over a first electrode material, and then patterning the first electrode material and the memory cell stack into a first set of spaced lines extending along a first horizontal direction. Spaced lines of second electrode material may be formed over the first set of spaced lines, and may extend along a second horizontal direction that is orthogonal to the first horizontal direction.

10 Claims, 26 Drawing Sheets

(56) References Cited

U.S. PATENT DOCUMENTS

| | | |
|---|---|---|
| 6,826,077 B2 | 11/2004 | Smith et al. |
| 6,980,465 B2 | 12/2005 | Taussig et al. |
| 6,984,530 B2 | 1/2006 | Lee et al. |
| 7,119,388 B2 | 10/2006 | Yates et al. |
| 7,126,200 B2 | 10/2006 | Seyyedy et al. |
| 7,259,076 B2 | 8/2007 | Hsu |
| 7,285,811 B2 | 10/2007 | Yates et al. |
| 7,323,349 B2 | 1/2008 | Hsu et al. |
| 7,413,945 B2 | 8/2008 | Vyvoda et al. |
| 7,560,339 B2 | 7/2009 | Herner et al. |
| 7,663,135 B2 | 2/2010 | Lung |
| 7,884,343 B2 | 2/2011 | Lung |
| 8,021,897 B2 | 9/2011 | Sills et al. |
| 8,207,557 B2 * | 6/2012 | Sills et al. .............. 257/211 |
| 2003/0025210 A1 | 2/2003 | Li et al. |
| 2004/0087072 A1 | 5/2004 | Vyvoda et al. |
| 2004/0100817 A1 | 5/2004 | Subramanian et al. |
| 2005/0054138 A1 | 3/2005 | Hsu et al. |
| 2005/0068830 A1 | 3/2005 | Eaton, Jr. |
| 2005/0254291 A1 | 11/2005 | Happ et al. |
| 2006/0189077 A1 | 8/2006 | Herner et al. |
| 2006/0234418 A1 | 10/2006 | Ufert |
| 2007/0045728 A1 | 3/2007 | Lee |
| 2007/0253243 A1 | 11/2007 | Fontana, Jr. et al. |
| 2008/0211007 A1 | 9/2008 | Yuan |
| 2008/0272363 A1 | 11/2008 | Mouli |
| 2008/0273363 A1 | 11/2008 | Mouli |

FOREIGN PATENT DOCUMENTS

| | | |
|---|---|---|
| TW | I298189 | 6/2008 |
| WO | WO PCT/US2010/021424 | 8/2010 |
| WO | WO PCT/US2010/021424 | 8/2011 |

* cited by examiner

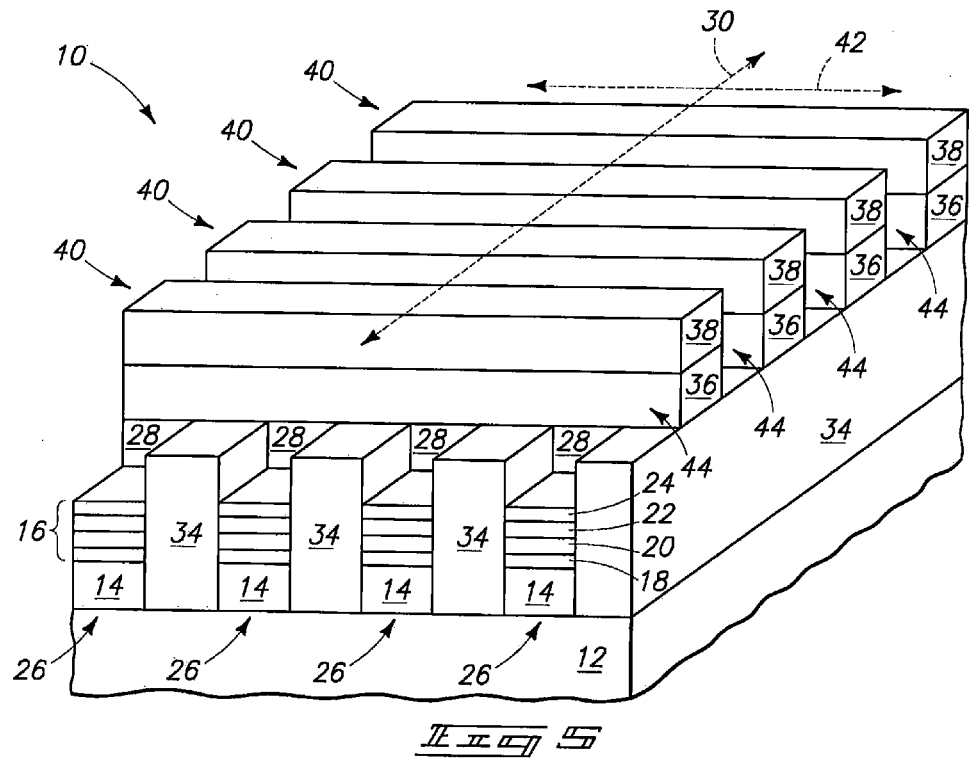
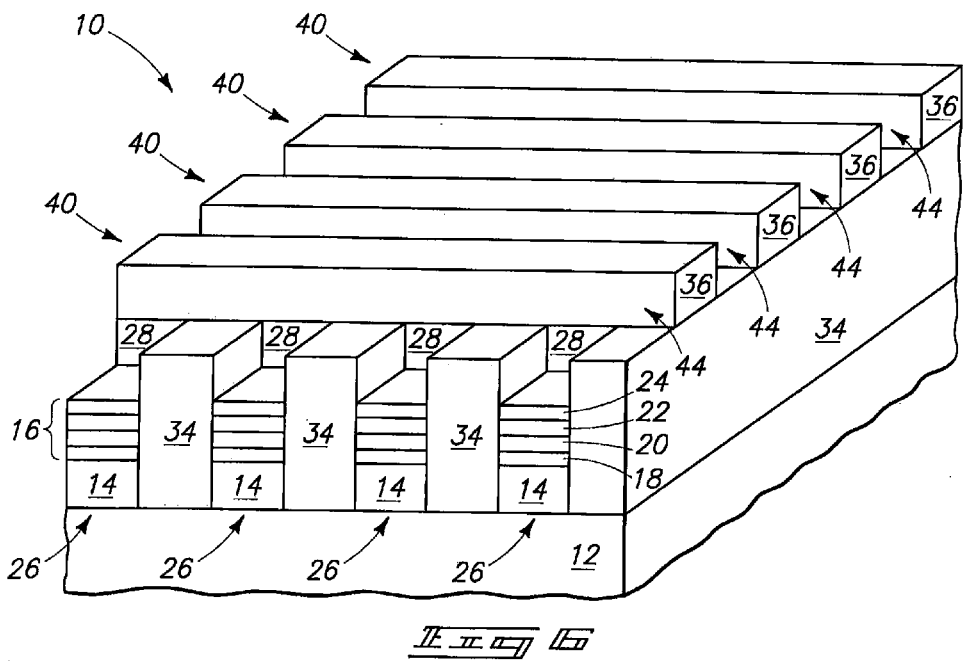

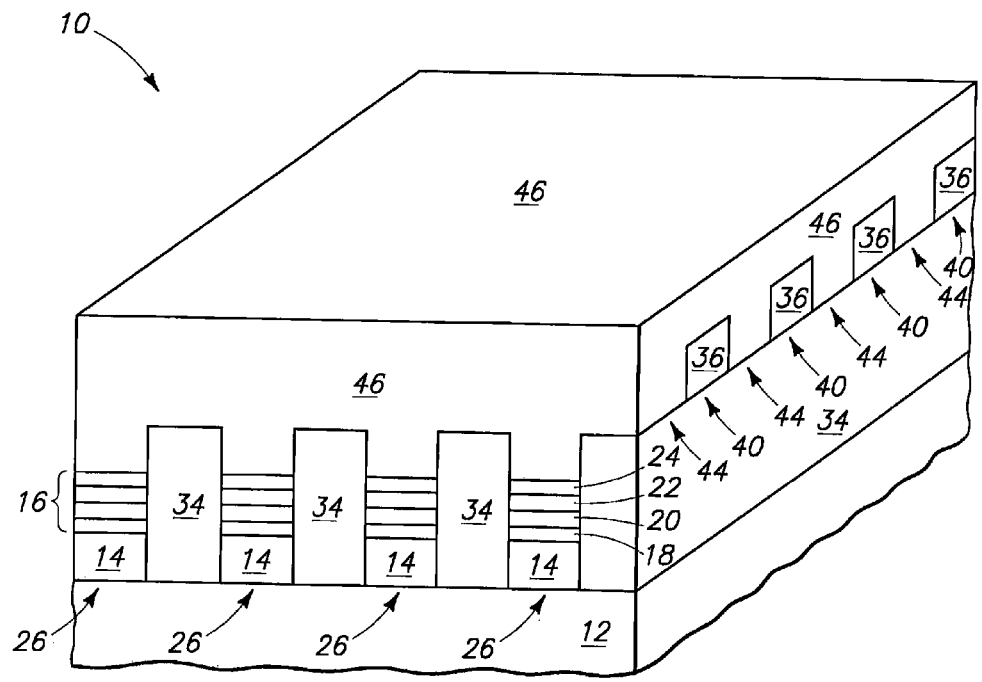
_FIG. 7_
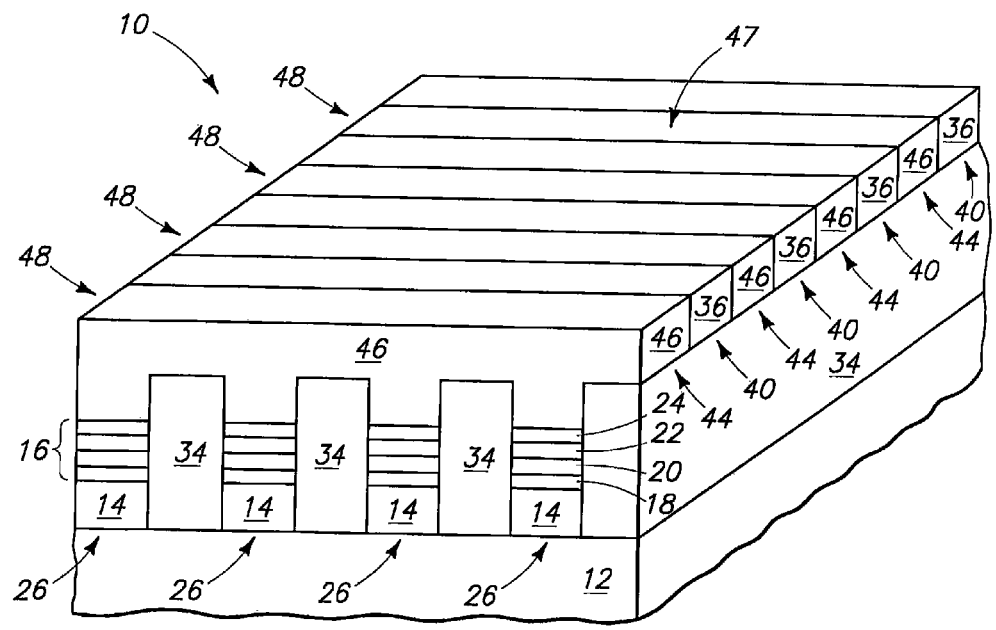
_FIG. 8_

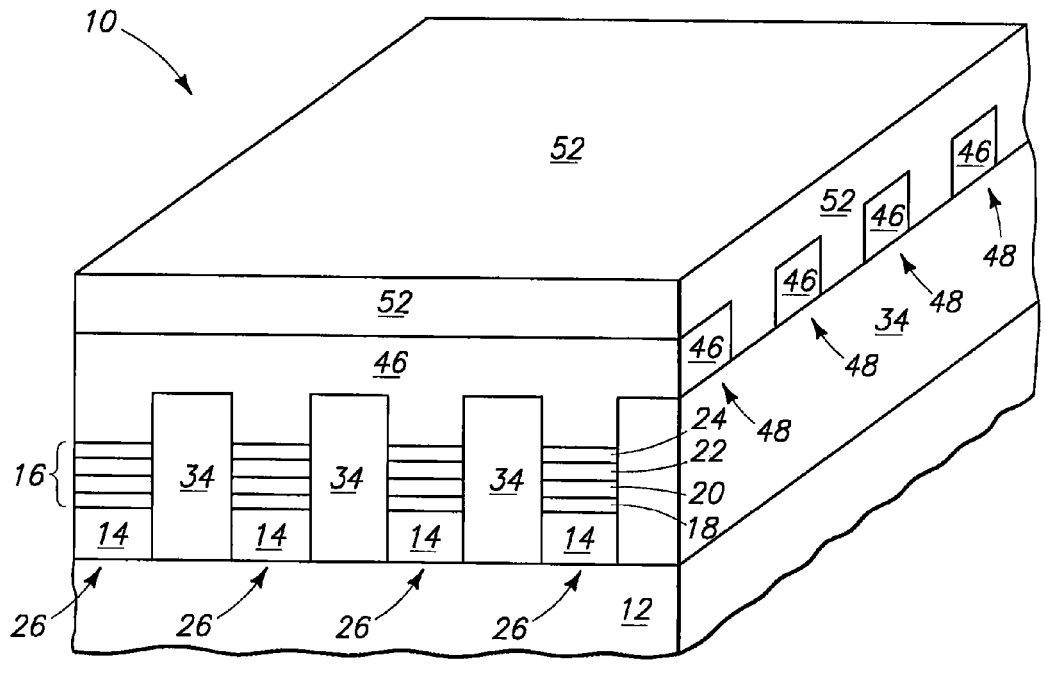
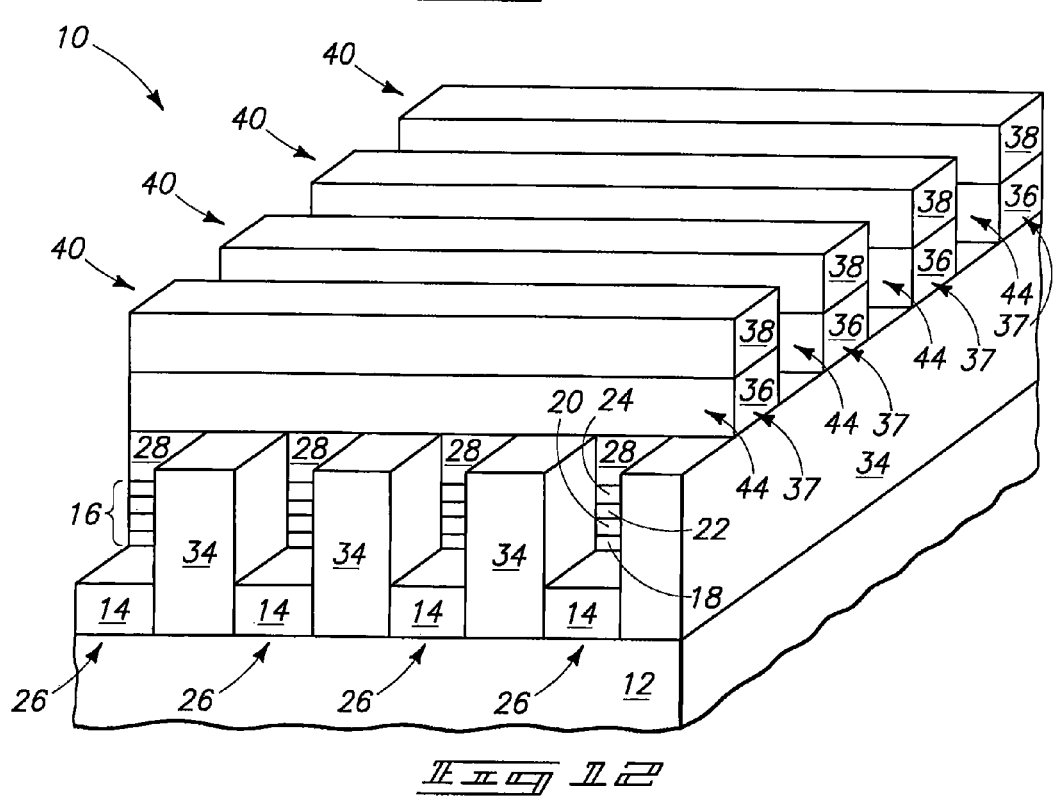

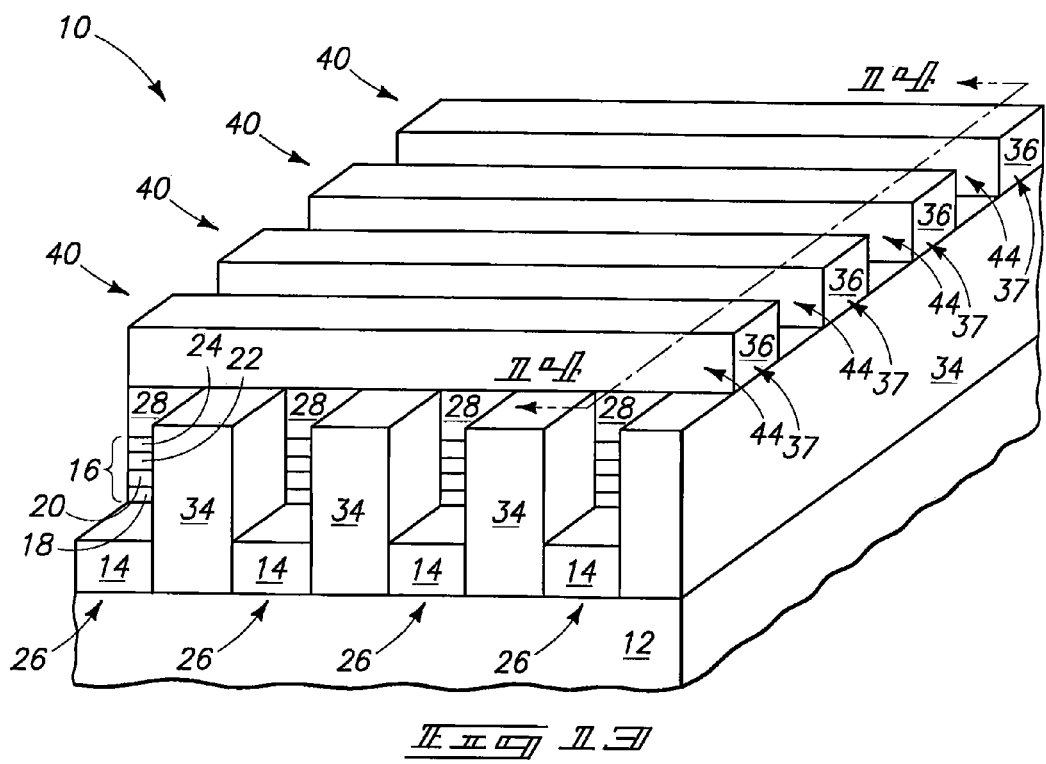
F I G. 23
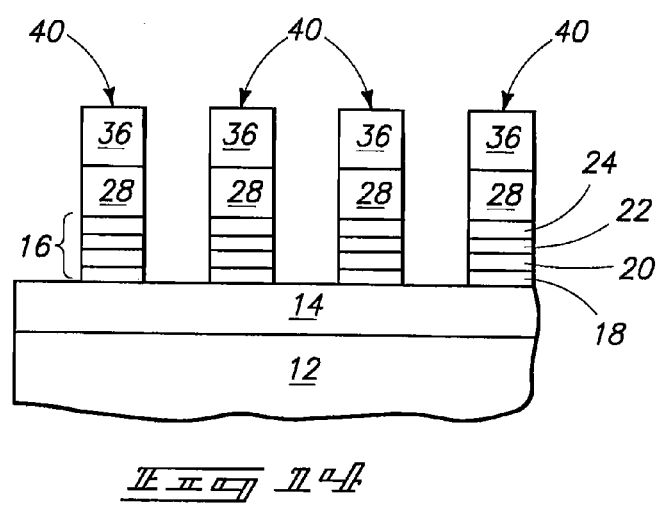
F I G. 24

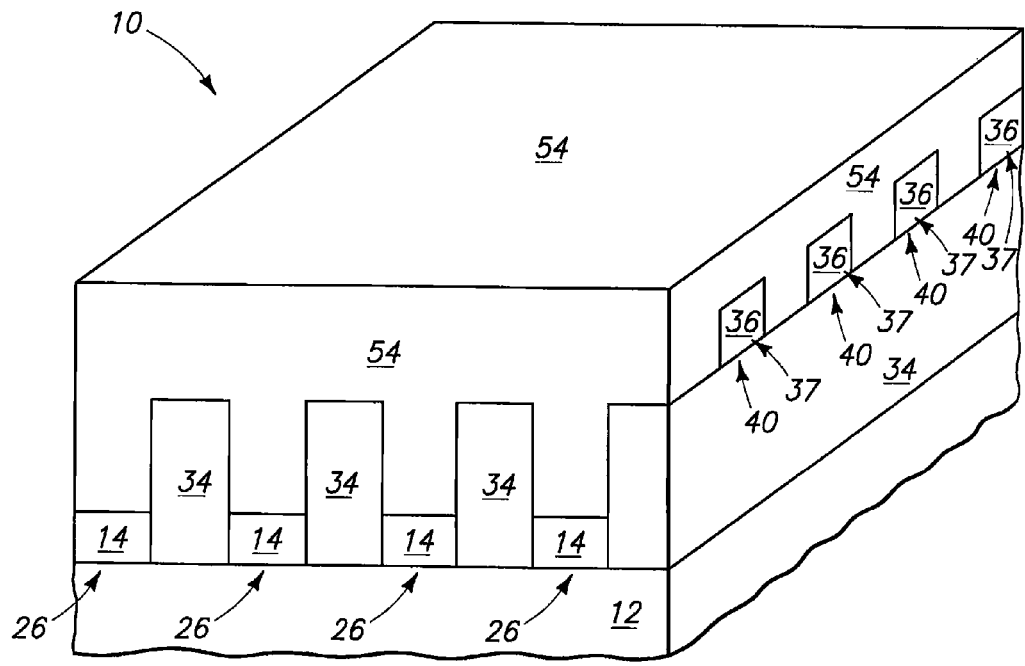
𝕗𝕀𝔾 𝟙𝟝
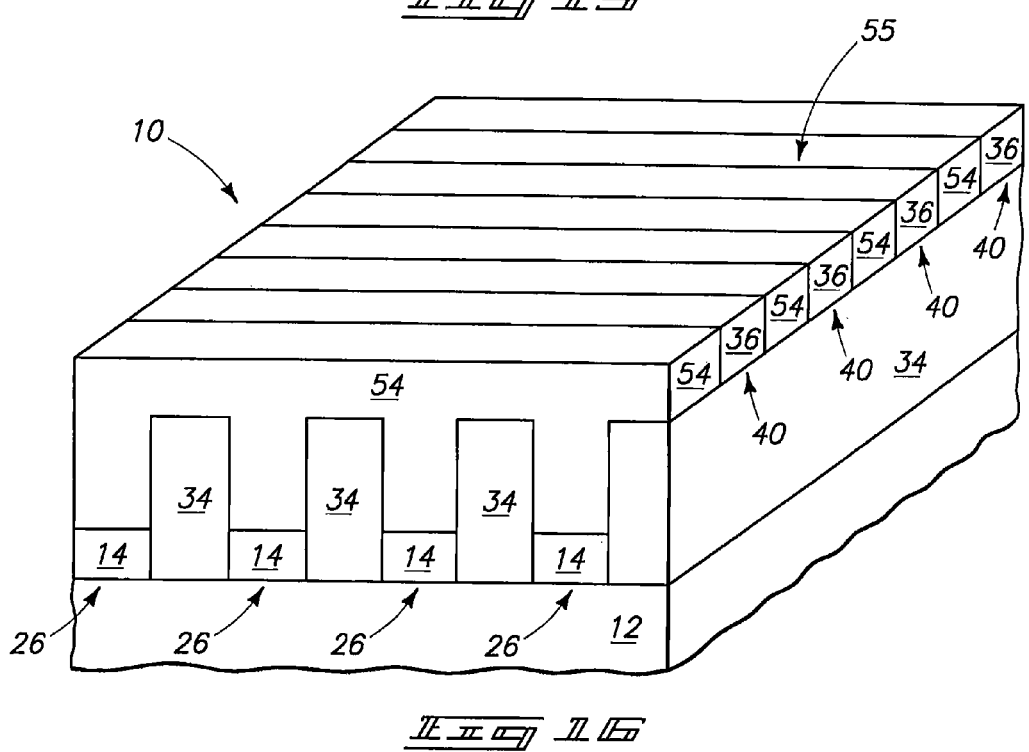
𝕗𝕀𝔾 𝟙𝟞

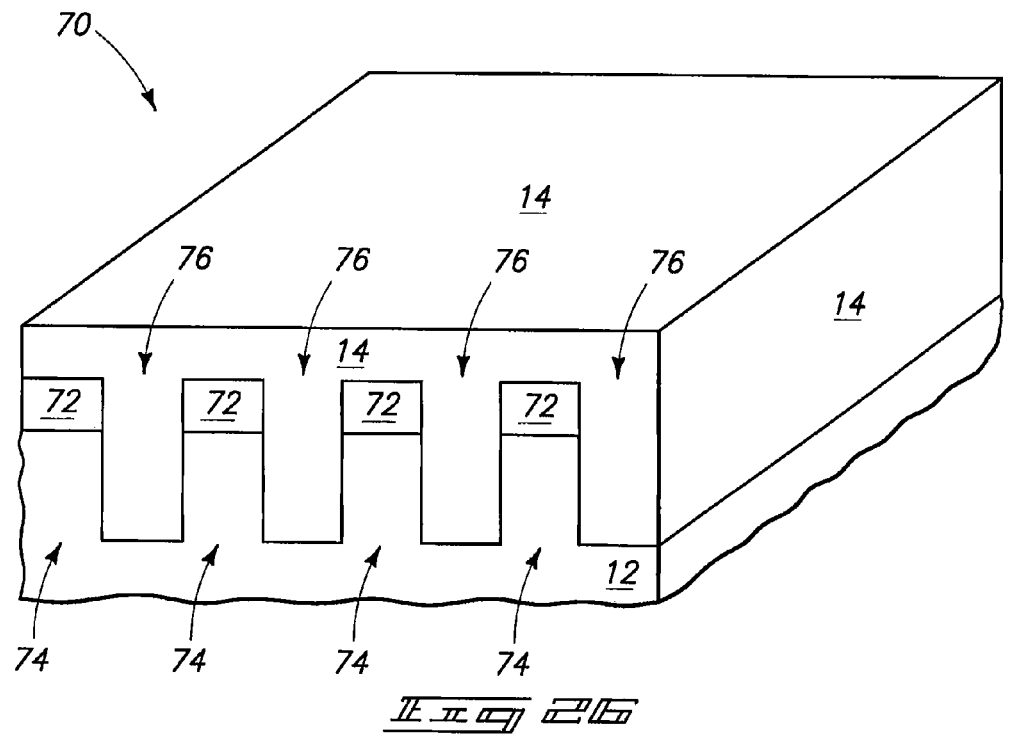
F I G 26
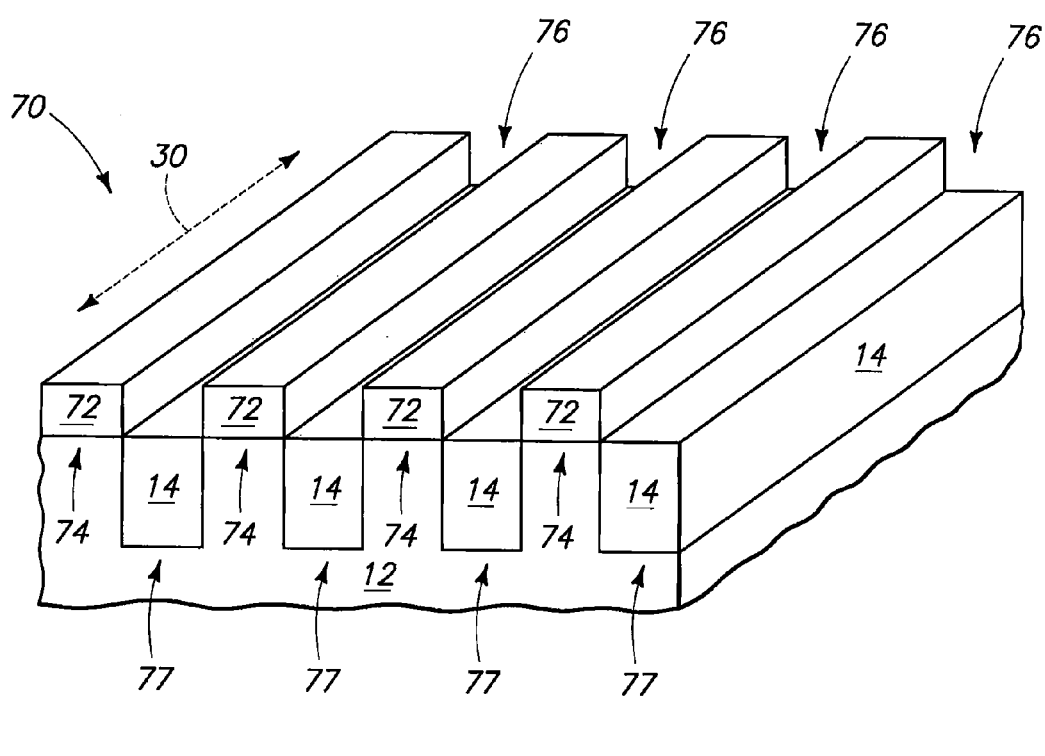
F I G 27

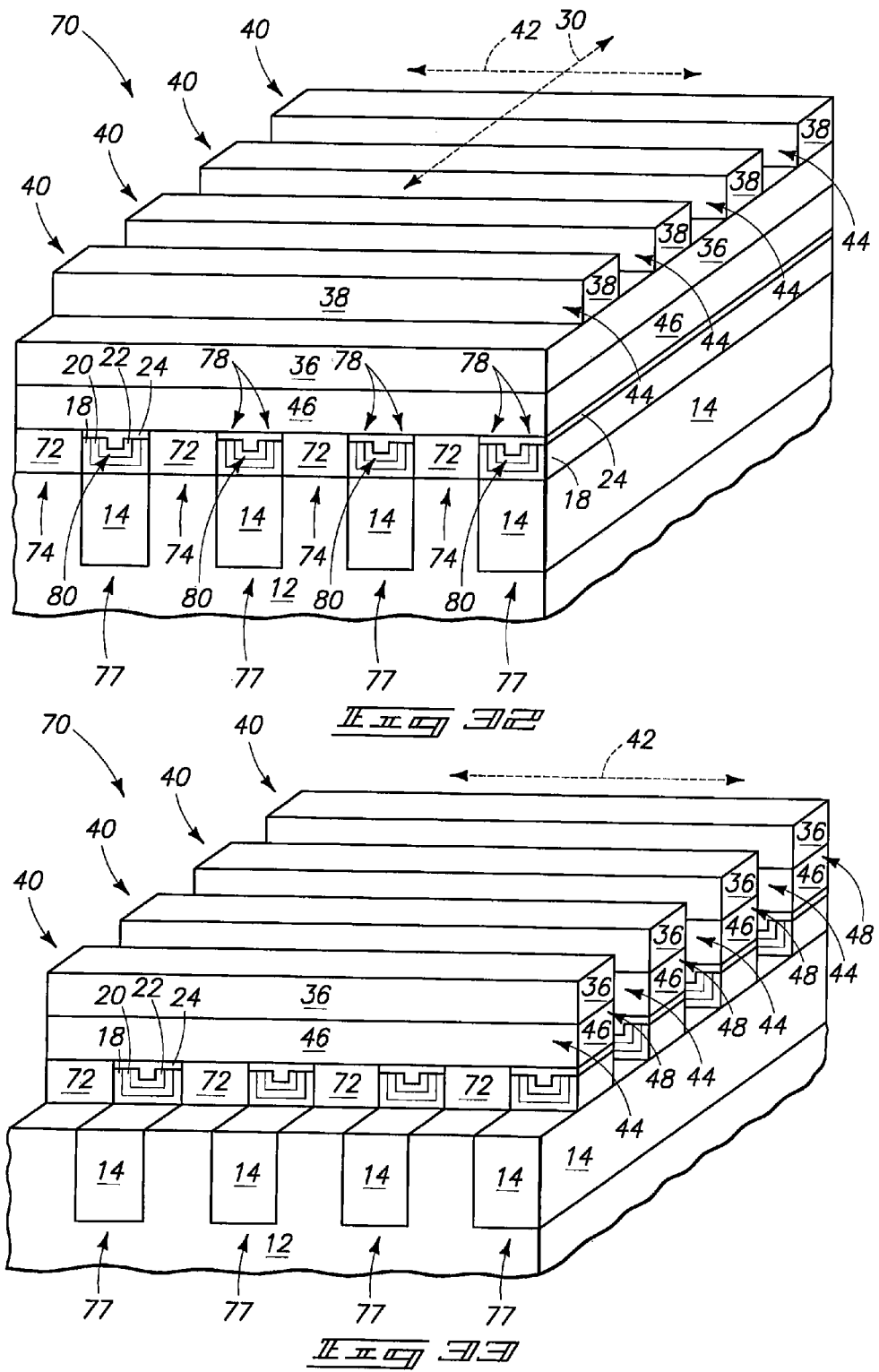

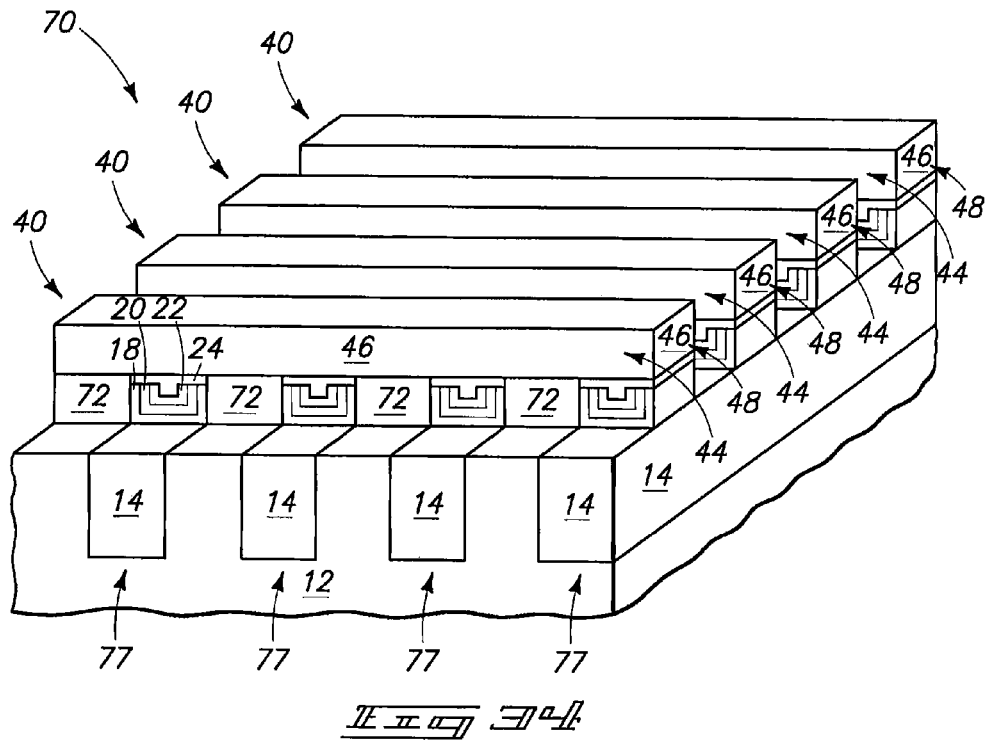
_FIG 34_
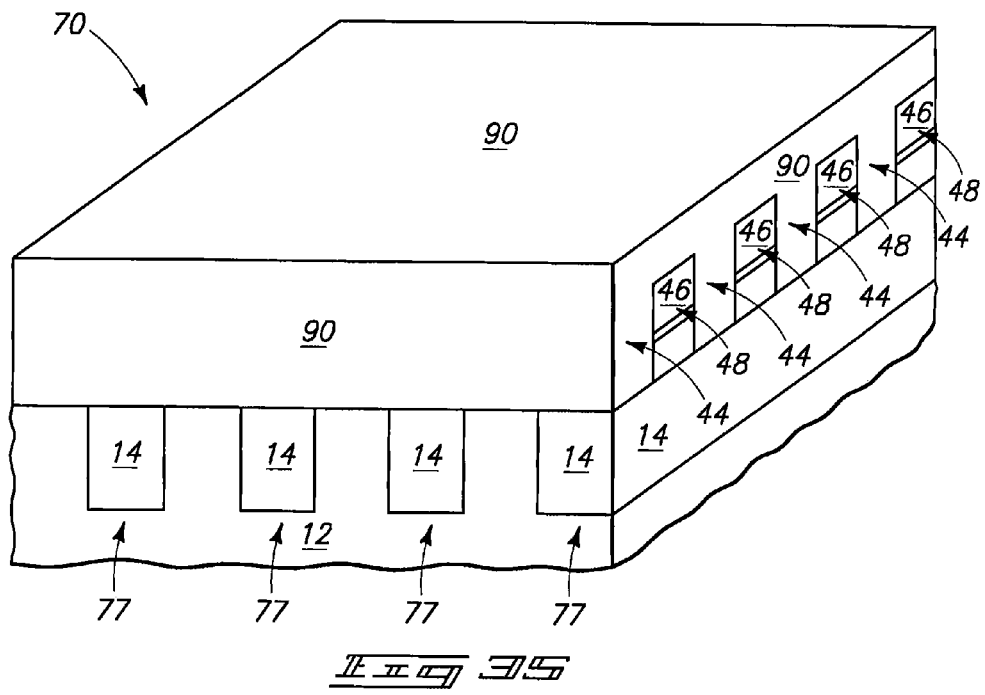
_FIG 35_

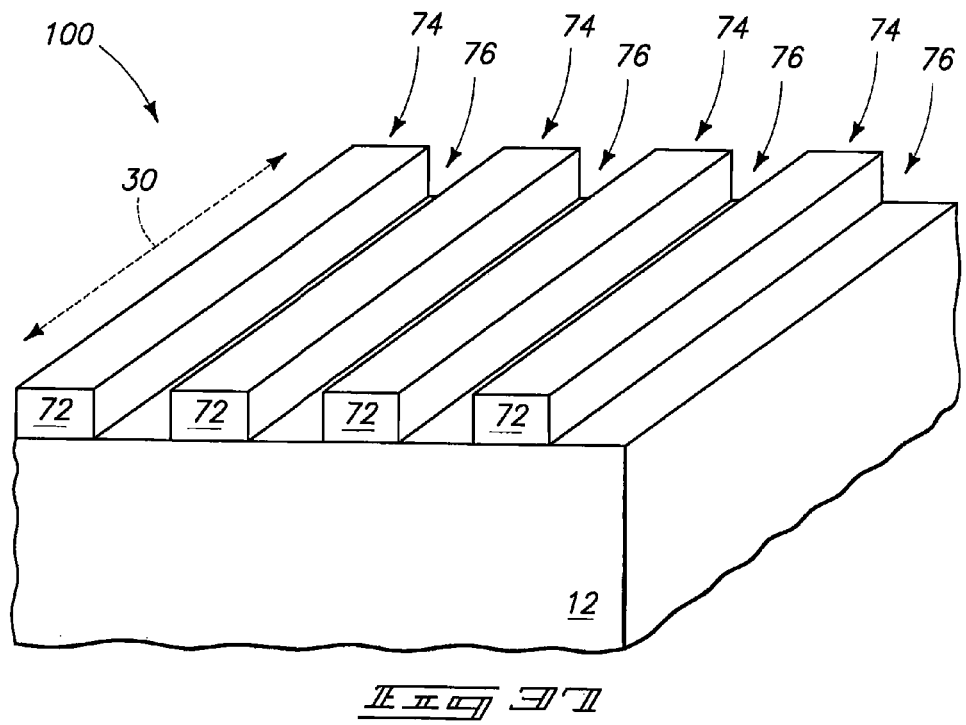
F I G 37
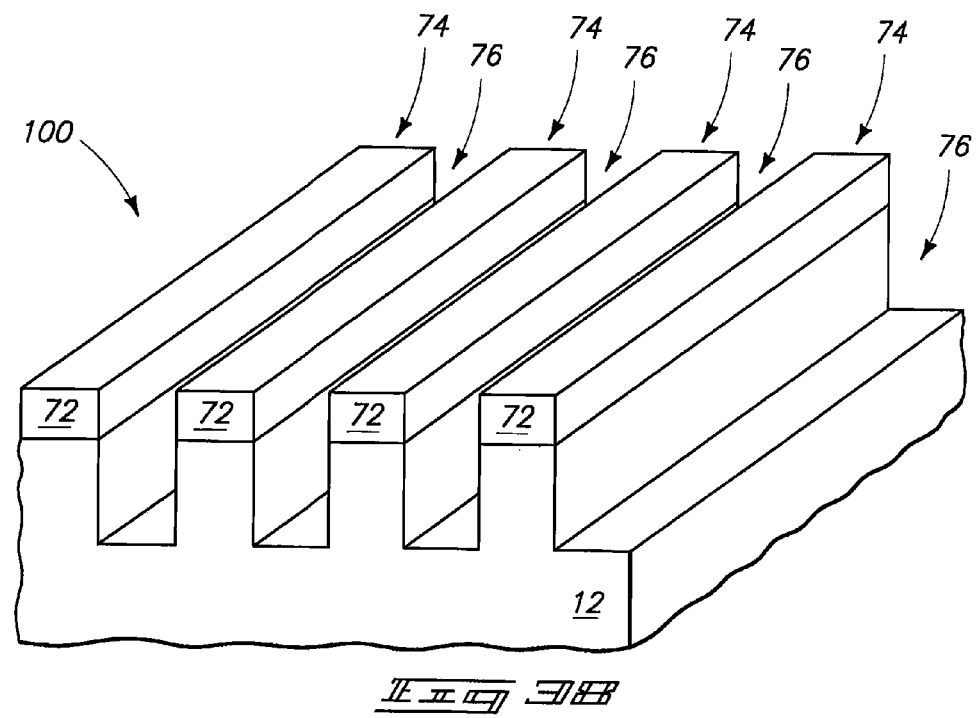
F I G 38

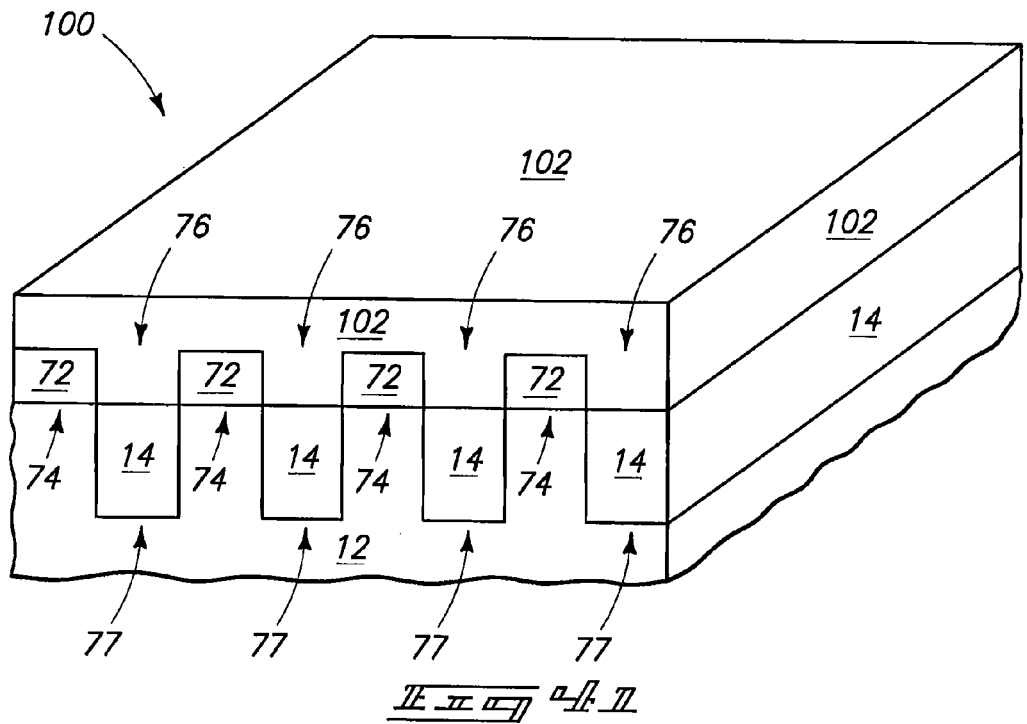
_FIG. 41_
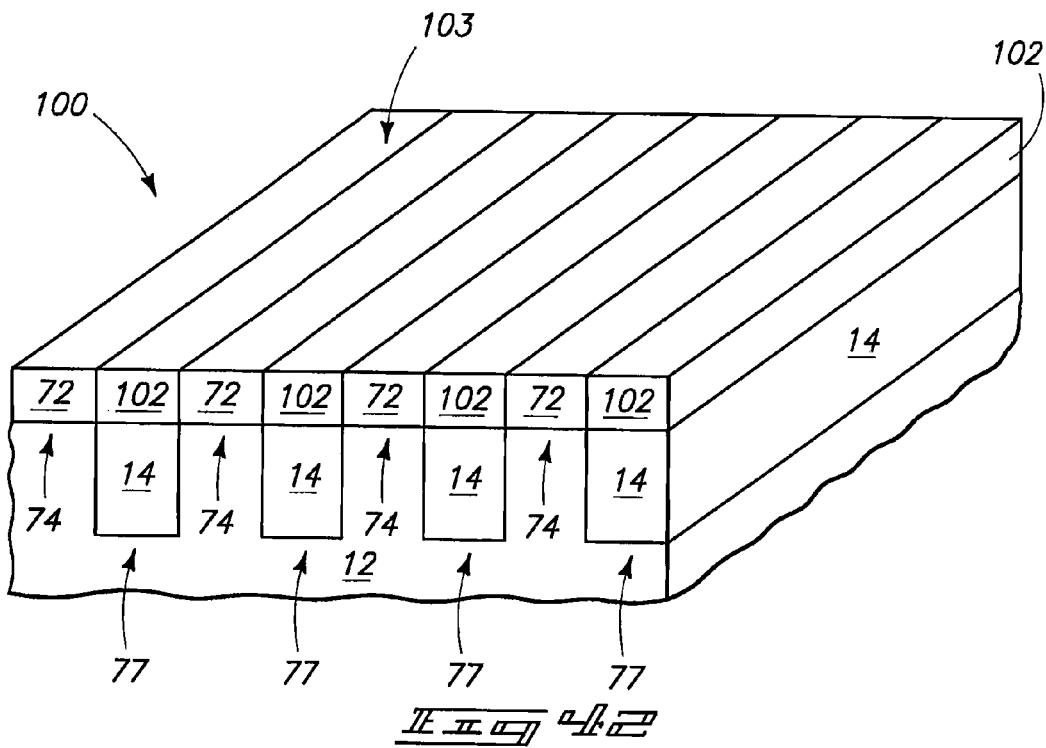
_FIG. 42_

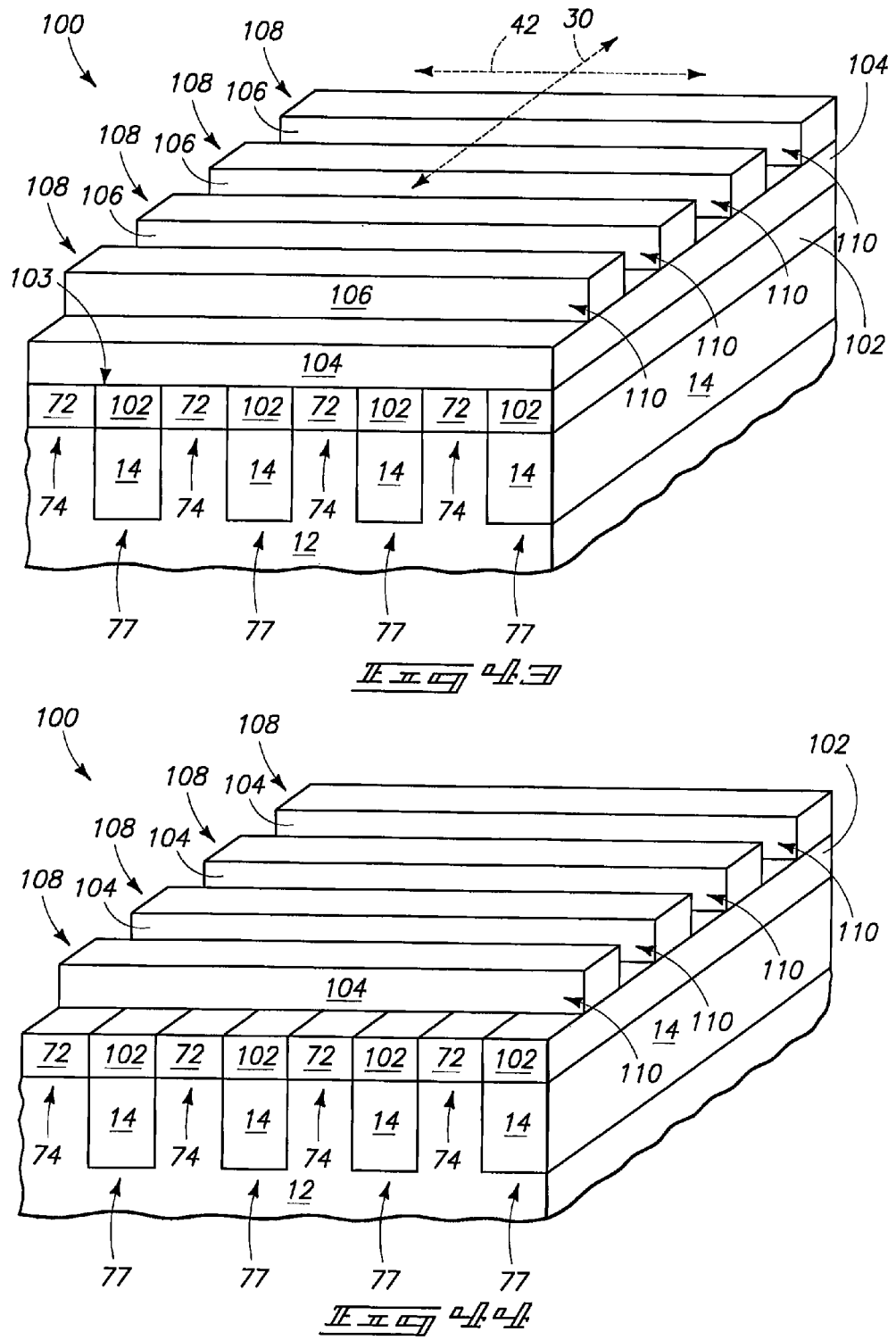

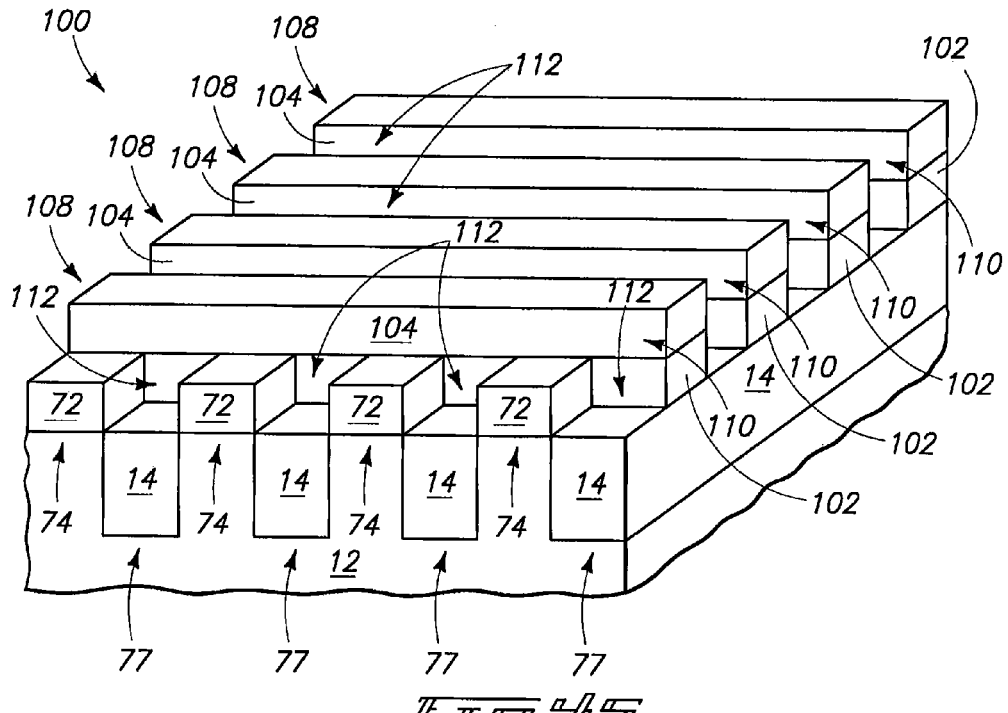
_FIG 45_
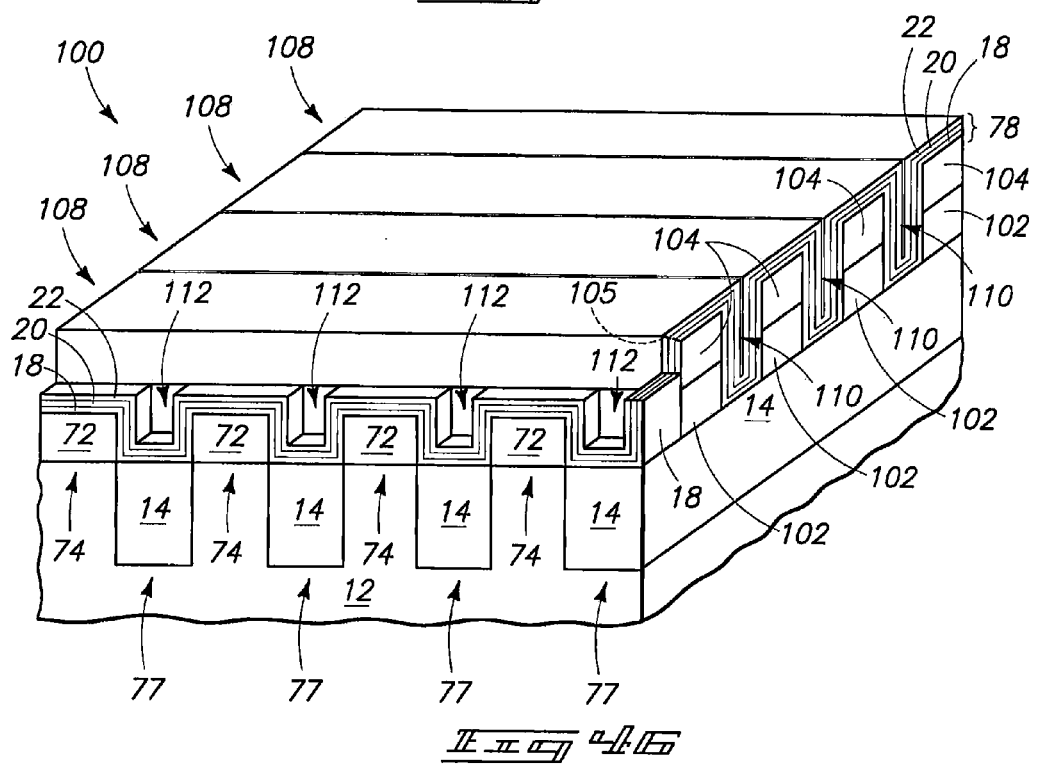
_FIG 46_

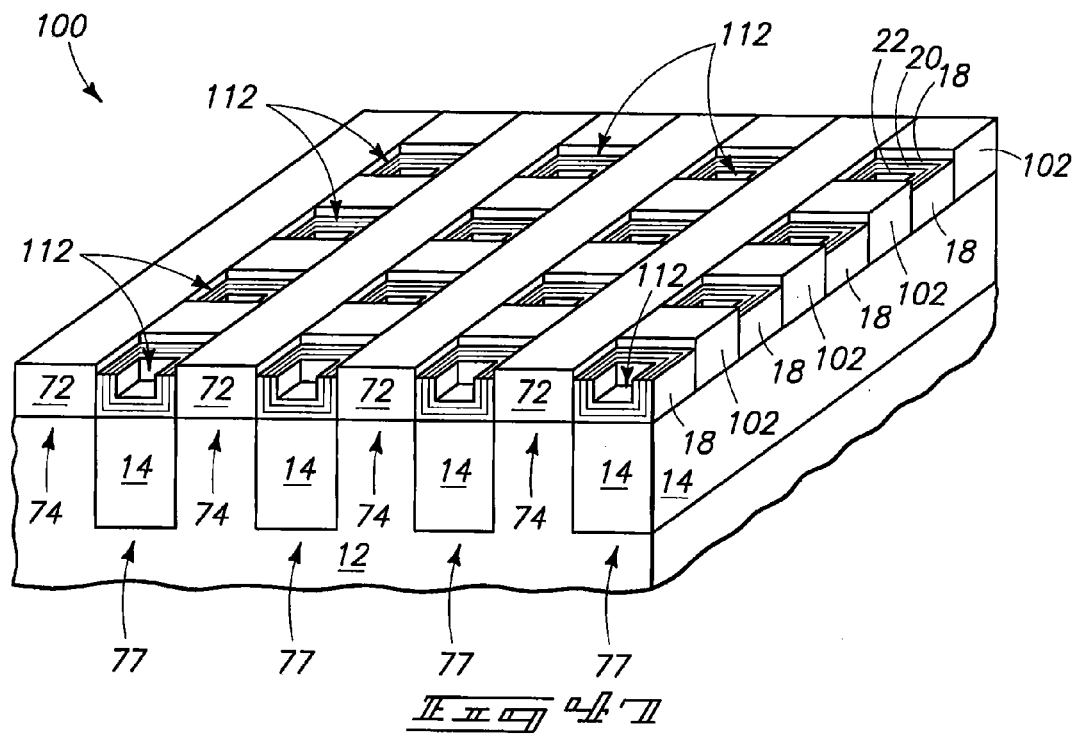
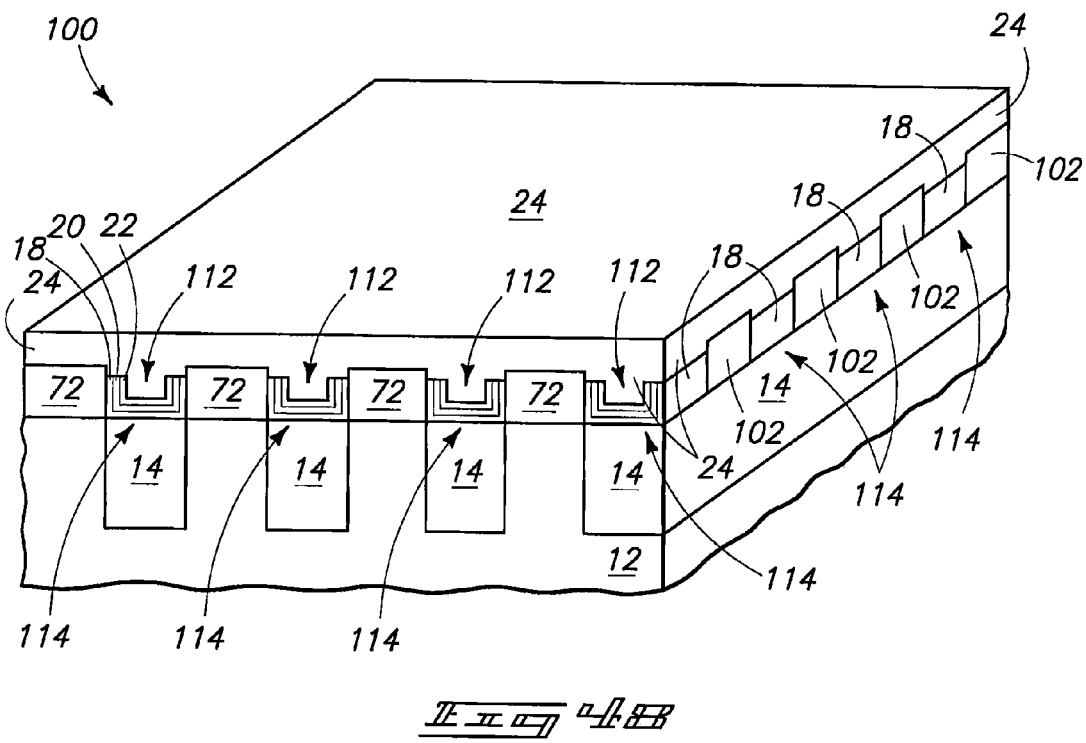

CROSS-POINT MEMORY STRUCTURES

RELATED PATENT DATA

This patent resulted from a continuation of U.S. patent application Ser. No. 13/213,718, which was filed Aug. 19, 2011, which issued as U.S. Pat. No. 8,207,557, and which is hereby incorporated herein by reference; which resulted from divisional of U.S. patent application Ser. No. 12/389,142, which was filed Feb. 19, 2009, which issued as U.S. Pat. No. 8,021,897, and which is hereby incorporated herein by reference.

TECHNICAL FIELD

Cross-point memory structures, and methods of forming memory arrays.

BACKGROUND

A continuing goal of integrated circuit fabrication is to decrease the amount of semiconductor real estate consumed by integrated circuit devices, and to thereby increase the level of integration.

Memory may utilize a large array of memory devices, with each memory device storing one or more data bits. Accordingly, reduction in the size of individual memory devices may translate into a large increase in the bit density. Common memory devices are dynamic random access memory (DRAM) devices, static random access memory (SRAM) devices, and nonvolatile devices (so-called flash devices). The nonvolatile devices may be incorporated into NAND or NOR memory array architectures.

The size of a memory device may be expressed in terms of the smallest feature size utilized in fabrication of the memory device. Specifically, if the smallest feature size is designated as "F", the memory device dimensions may be expressed in units of F. Conventional DRAM memory frequently comprises dimensions of at least $6F^2$, and SRAM may require even more semiconductor real estate.

A type of memory that potentially consumes very little semiconductor real estate is so-called cross-point memory. In cross-point memory, a memory cell occurs at overlap between a wordline and a bitline. Specifically, a memory element material is provided between the wordline and bitline. The memory element material comprises one or more substances which undergo stable and detectable change upon exposure to current; and may be, for example, a perovskite material, a chalcogenide material, an ionic transport material, a resistive switching material, a polymeric material and/or a phase change material. Since the memory cell may be confined to a region of overlap of a bitline and wordline, the memory cell may be theoretically formed to dimensions of $4F^2$ or less.

It is desired to develop improved methods for forming cross-point memory; and to develop improved cross-point memory structures.

BRIEF DESCRIPTION OF THE DRAWINGS

FIGS. 1-9 and 11 are diagrammatic, three-dimensional views of a portion of a construction at various process stages of an example embodiment process for forming a memory array.

FIGS. 12, 13, 15-17, 19, 20 and 22 are diagrammatic, three-dimensional views of a portion of a construction at various process stages of another example embodiment process for forming a memory array. The process stage of FIG. 12 follows the processing stage of FIG. 4, and is alternative to that of FIG. 5. FIG. 14 is a cross-sectional view along the line 14-14 of FIG. 13.

FIGS. 24-35 are diagrammatic, three-dimensional views of a portion of a construction at various process stages of another example embodiment process for forming a memory array.

FIGS. 37-48 are diagrammatic, three-dimensional views of a portion of a construction at various process stages of another example embodiment process for forming a memory array.

DETAILED DESCRIPTION OF THE ILLUSTRATED EMBODIMENTS

Some embodiments include processing methods which may be utilized to form arrays of cross-point memory cells, and some embodiments include cross-point memory structures. Example embodiments are described with reference to FIGS. 1-48.

Figure 1:
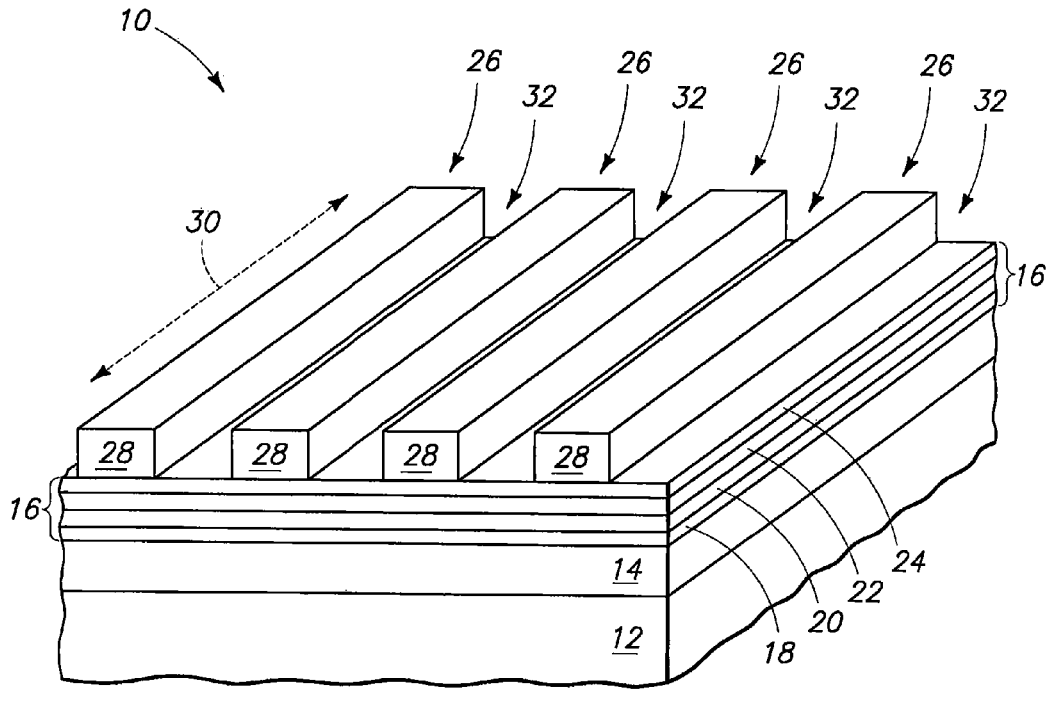

FIG. 1 shows a portion of a construction 10. The construction includes a base 12. The base may comprise an electrically insulative material, such as, for example, one or more of silicon dioxide, silicon nitride, and silicon oxynitride. Although the base is shown to be homogeneous, in some embodiments the base may comprise multiple layers and materials associated with the fabrication of integrated circuitry. For instance, the base may comprise the above-discussed insulative material supported over a semiconductor material. The semiconductor material may comprise, consist essentially of or consist of monocrystalline silicon. If the base comprise a semiconductor material, base 12 may be referred to as a semiconductor substrate. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. If base 12 is a semiconductor substrate, construction 10 may be referred to as a semiconductor construction.

A first electrode material (which may also be referred to as a bottom electrode material) 14 is formed over base 12. The first electrode material 14 physically contacts an upper surface of base 12.

First electrode material 14 may comprise any suitable composition or combination of compositions; and in some embodiments may comprise, consist essentially of, or consist of one or more compositions selected from the group consisting of platinum, titanium nitride and tantalum nitride.

A memory stack 16 is formed over the first electrode material 14. The memory stack comprises, in ascending order from the first electrode material, a first insulative material 18, a second insulative material 20, an electrically conductive material 22, and a memory element material 24.

The first and second insulative materials (18 and 20) together with the first electrode material 14 and the electrically conductive material 22 form a metal-insulator-insulator-metal (MIIM) diode. The electrically conductive material 22 may have a work function which is high relative to the work function of the first electrode material; and may, for example, comprise, consist essentially of, or consist of one or more compositions selected from the group consisting of tantalum silicon nitride, chromium and tantalum. The insulative materials may comprise any suitable compositions or combinations of compositions, and may be tailored relative to one another so that bandgaps, and/or conduction band edges, and/or valence band edges, between the materials enable tunneling of carriers in one direction, but not in an opposing direction. The insulative materials are thus compositionally different from one another, and each may, for example, comprise, consist essentially of, or consist of one or more compositions selected from the group consisting of aluminum oxide, silicon oxide, silicon nitride, zirconium oxide and hafnium oxide.

Although the shown diode is an MIIM diode, and thus comprises two insulative materials, in other embodiments the diode may comprise three or more insulative materials. The diode may be, for example, analogous to diodes described in US patent publication 2008/0273363. In some embodiments, one of the insulative materials may be a native oxide on the first electrode material.

The memory element material 24 may comprise any suitable composition or combination of compositions, and in some embodiments may be a perovskite material, a chalcogenide material, an ionic transport material, a resistive switching material, a polymeric material and/or a phase change material. If material 24 is a phase change material, the material may, for example, comprise, consist essentially, or consist of a mixture of germanium, antimony and tellurium.

A patterned masking material 28 is formed over memory element material 24. The patterned masking material is in the form of a plurality of spaced lines 26, with such lines extending primarily along a horizontal direction 30. In the shown embodiment, all of the lines extend exactly along the horizontal direction 30. In other embodiments the lines may have variation so that they extend mostly along horizontal direction 30, but have some waviness or other features so that the lines do not extend entirely along the horizontal direction 30. The term "primarily" in the phrase "extending primarily along the indicated horizontal direction" is used to indicate that the lines extend at least mostly along the indicated horizontal direction.

Masking material 28 may comprise any suitable composition or combination of compositions; and may, for example, comprise, consist essentially of, or consist of one or more of photoresist, amorphous carbon, transparent carbon, silicon dioxide, silicon nitride and silicon oxynitride. The material may be homogeneous (as shown), or may comprise a stack of two or more different compositions.

The spaced lines are separated from one another by gaps 32.

In some embodiments, the spaced lines may be referred to as a first set of spaced lines, to distinguish the spaced lines from other lines that may be formed subsequently.

The lines 26 of masking material 28 may be formed with any suitable processing. In some embodiments, the lines may be formed by initially forming a layer of material 28 entirely across masking element 24; forming a photolithographically-patterned mask over the layer of material 28; transferring a pattern from the photolithographically-patterned mask into the underlying material 28 to form the lines 26 of such material; and then removing the photolithographically-patterned mask to leave the construction shown in FIG. 1. If material 28 includes photoresist, the material 28 may consist of photolithographically-patterned photoresist, or may comprise the photolithographically-patterned photoresist mask over an underlying composition. In some embodiments, lines 26 may comprise sub-photolithographic resolution features that are formed using pitch multiplication techniques, e.g. spacer pitch-doubling or pitch-quadrupling techniques. In other embodiments, lines 26 may comprise sub-photolithographic resolution features that are formed using self-assembly or directed-assembly techniques, e.g. block copolymer microphase separation. In even other embodiments, lines 26 may comprise sub-photolithographic resolution features that are formed using particle beam lithography techniques, e.g. electron beam lithography.

Figure 2:
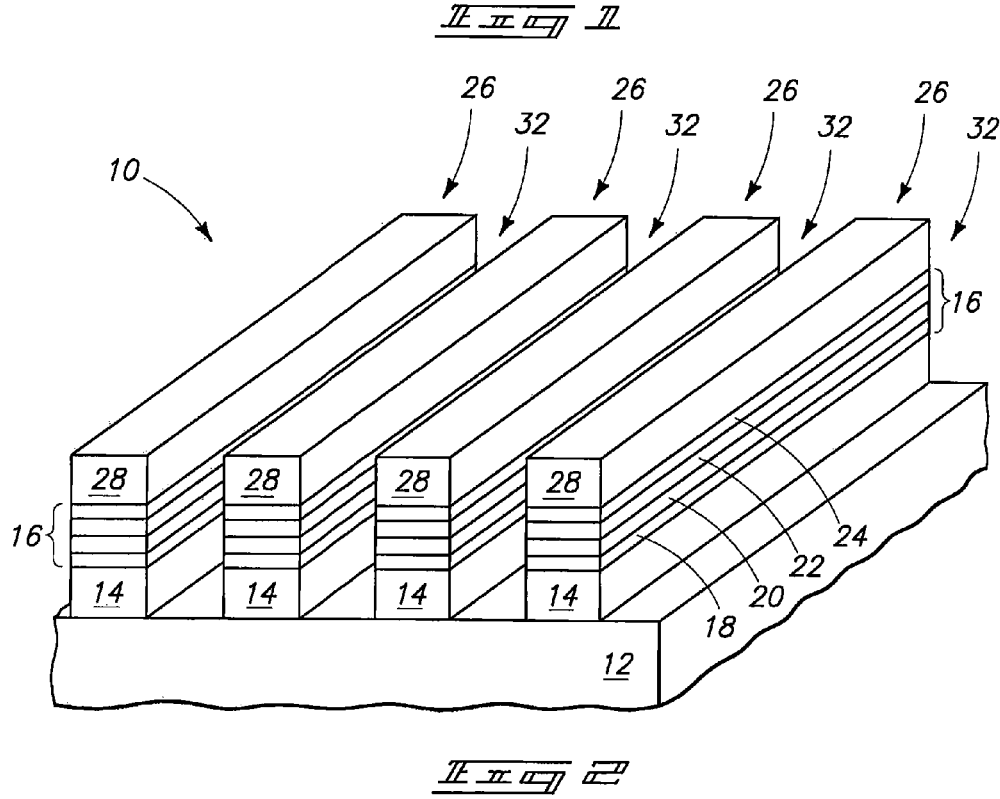

Referring to FIG. 2, a pattern is transferred from patterned masking material 28 into first electrode material 14 and memory cell stack 16 with one or more etches, so that the first electrode material 14 and memory cell stack 16 adopt the pattern of the patterned masking material 28. Specifically, the first electrode material 14 and memory cell stack 16 adopt the pattern of the first set of spaced lines 26 extending primarily along the first horizontal direction 30. The patterning extends gaps 32 entirely through materials 14, 18, 20, 22 and 24; and to an upper surface of base 12.

Figure 3:
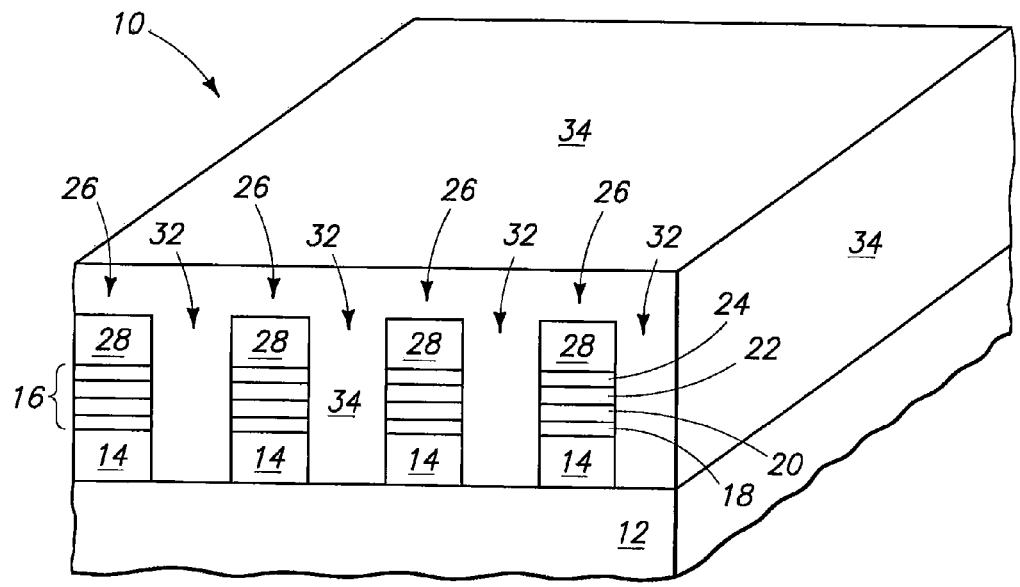

Referring to FIG. 3, a dielectric material 34 is formed over lines 26, and within the gaps 32 between the lines. Dielectric material 34 may comprise any suitable composition or combination of compositions; and may, for example, comprise, one or more of silicon dioxide, silicon nitride, silicon oxynitride, and various doped silicon oxides (for instance, borophosphosilicate glass, borosilicate glass, fluorosilicate glass, etc.).

In the shown embodiment, masking material 28 remains over memory cell stack 16 during formation of dielectric material 34. In other embodiments, masking material 28 may be removed prior to formation of dielectric material 34.

Figure 4:
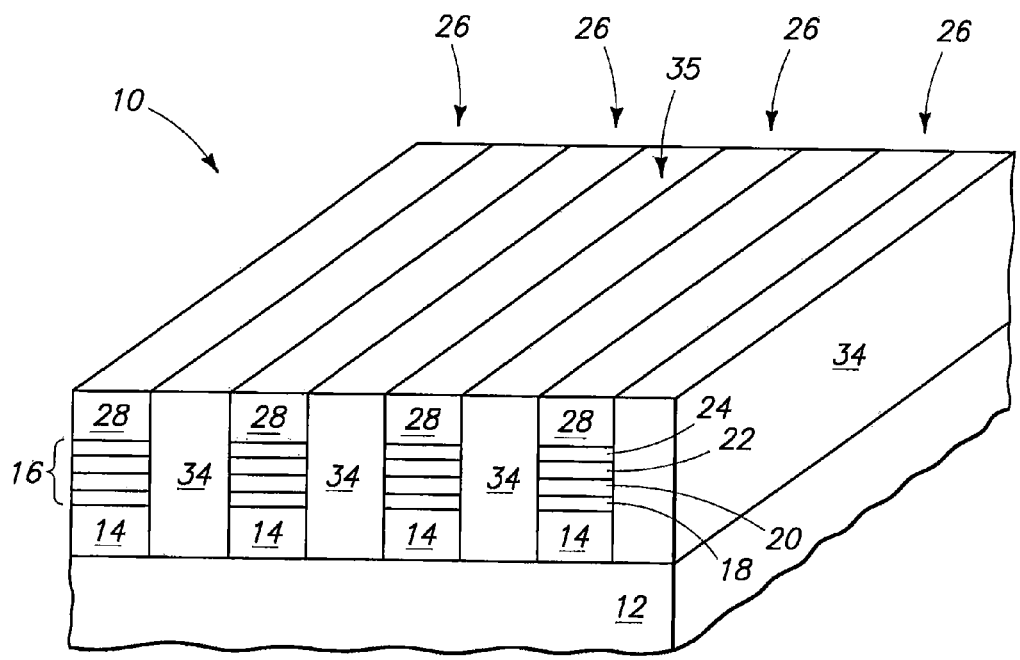

Referring to FIG. 4, material 34 is removed from over lines 26. Such removal may be accomplished utilizing any suitable processing. For instance, the removal may be accomplished utilizing an etch-back and/or planarization (for instance, chemical-mechanical polishing [CMP]). In the shown embodiment, such removal is accomplished utilizing planarization to form a planarized upper surface 35 extending across materials 28 and 34.

Referring to FIG. 5, patterned masking materials 36 and 38 are formed over lines 26 and over the dielectric material 34 in the gaps between lines 26. The patterned masking materials 36 and 38 comprise a plurality of lines 40 extending primarily along a second horizontal direction 42 orthogonal to the first horizontal direction 30. The lines 40 may be referred to as a second set of lines to distinguish them from the first set of lines 26.

Material 36 may correspond to a so-called hard masking material, and may comprise any of the compositions discussed above regarding masking material 28.

Material 38 may correspond to photolithographically-patterned photoresist.

Patterned lines 40 may be formed by initially forming a layer of material 36 entirely across upper surface 35 (FIG. 4), forming photolithographically-patterned photoresist 38 over the layer of material 36, and then transferring a pattern from the photolithographically-patterned photoresist into material 36 with one or more etches.

Lines 40 are spaced from one another by gaps 44. After lines 40 are formed, material 28 is removed from within gaps 44 by one or more suitable etches.

Referring to FIG. 6, material 38 (FIG. 5) is removed from lines 40.

Referring to FIG. 7, top electrode material 46 is formed over lines 40 and within the gaps 44 between lines 40. Top electrode material 46 may comprise any suitable composition or combination of compositions; and in some embodiments may comprise one or more of various metals (platinum, palladium, tungsten, titanium, etc.), metal-containing compositions (metal nitride, metal silicides, etc.) and conductively-doped semiconductor materials (conductively-doped silicon, conductively-doped germanium, etc.).

Referring to FIG. 8, top electrode material 46 is removed from over lines 40. Such removal may be accomplished utilizing any suitable processing. For instance, the removal may be accomplished utilizing an etch-back and/or planarization (for instance, CMP). In the shown embodiment, such removal is accomplished utilizing planarization to form a planarized upper surface 47 extending across materials 46 and 36.

The top electrode material 46 remaining at the processing stage of FIG. 8 is in the form of a plurality of spaced lines 48 formed within the gaps 44 between lines 40. In some embodiments, lines 48 may be referred to as a second set of spaced electrically-conductive lines to distinguished them from the first set of spaced electrically-conductive lines 26 of electrode material 14. In some embodiments, lines 26 may be referred to as a first set of spaced lines, lines 40 may be referred to as a second set of spaced lines, and lines 48 may be referred to as a third set of spaced lines.

Figure 9:
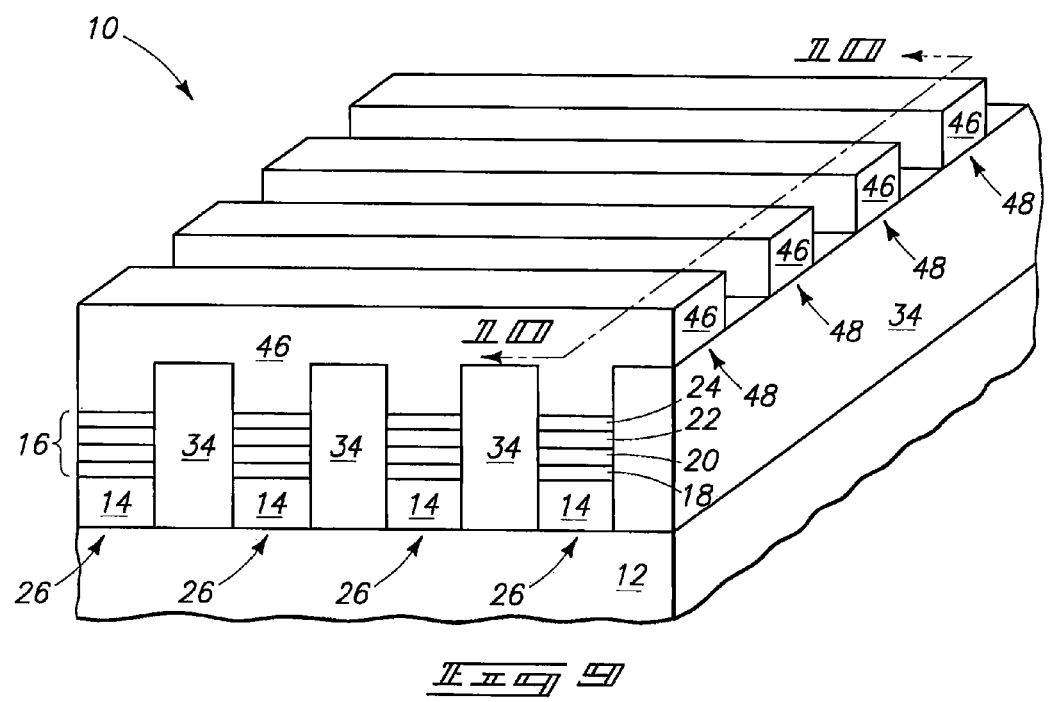
Figure 10:
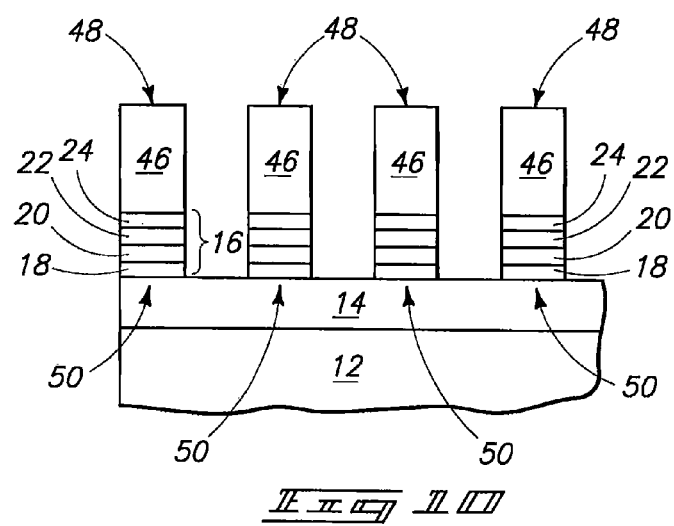
FIG. 10 is a cross-sectional view along the line 10-10 of FIG. 9.

Referring to FIGS. 9 and 10, material 36 (FIG. 8) is removed from between lines 48; and subsequently the materials 18, 20, 22 and 24 of memory cell stacks 16 are removed from the regions between the lines 48. The removal of materials 18, 20, 22 and 24 from between lines 48 forms the remaining materials 18, 20, 22 and 24 into an array of memory unit cells 50 (only some of which are labeled). The individual memory unit cells comprise memory cell stack 16 between the first electrode material 14 and the second electrode material 46.

Referring to FIG. 11, dielectric material 52 is formed over lines 48, and within gaps between the lines 48. Dielectric material 52 may be referred to as a second dielectric material to distinguish it from the first dielectric material 34. Dielectric material 52 may comprise any of the compositions discussed above regarding dielectric material 34. In some embodiments, dielectric material 52 may be a same composition as dielectric material 34; and in other embodiments may be a different composition from dielectric material 34. In some embodiments, dielectric material 52 may be considered to replace the spaced lines 40 that had been between the spaced lines 48 of the first electrode material 46 at an earlier processing stage (FIG. 8).

The processing of FIGS. 1-11 removes conductive material 22 of the memory cell stack 16 after formation of the lines 48 of top electrode material 46. Specifically, the lines 48 are utilized as a mask during etching of the materials of the memory cell stack 16. In other embodiments, at least some of materials of the memory cell stack may be removed prior to forming the top electrode material. FIGS. 12-22 illustrate an example embodiment in which materials of a memory cell stack are removed prior to forming top electrode material 46.

Referring to FIG. 12, construction 10 is shown at a processing stage subsequent to that of FIG. 4, and analogous to that of FIG. 5. However, unlike the processing stage of FIG. 5, the materials of memory cell stack 16 are removed from between lines 40 of patterned masking materials 36 and 38. In the shown embodiment, all of the materials of the memory cell stack are removed between lines 40. However, as long as conductive material 22 and memory element material 24 are removed from between the lines 40, an array of isolated memory cells may be formed. Accordingly, in some embodiments it is only materials 22 and 24 that are removed between lines 40; and in other embodiments it may be materials 20, 22 and 24 removed from between lines 40; and in yet other embodiments all of materials 18, 20, 22 and 24 of the memory cell stacks 16 may be removed from between lines 40 (as shown).

Figure 18:
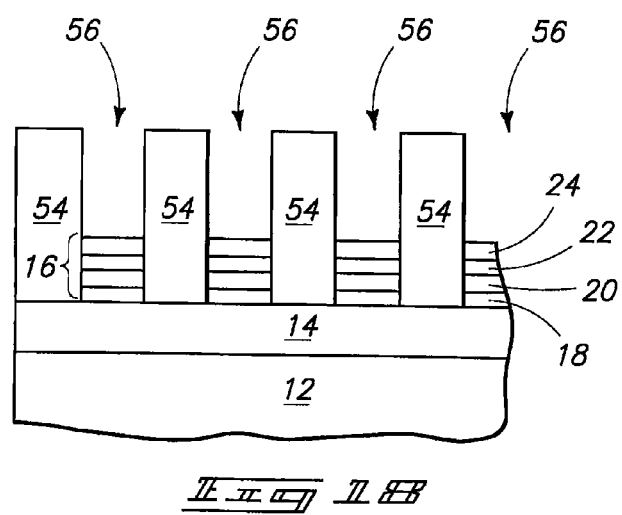
FIG. 18 is a cross-sectional view along the line 18-18 of FIG. 17.
Figure 19:
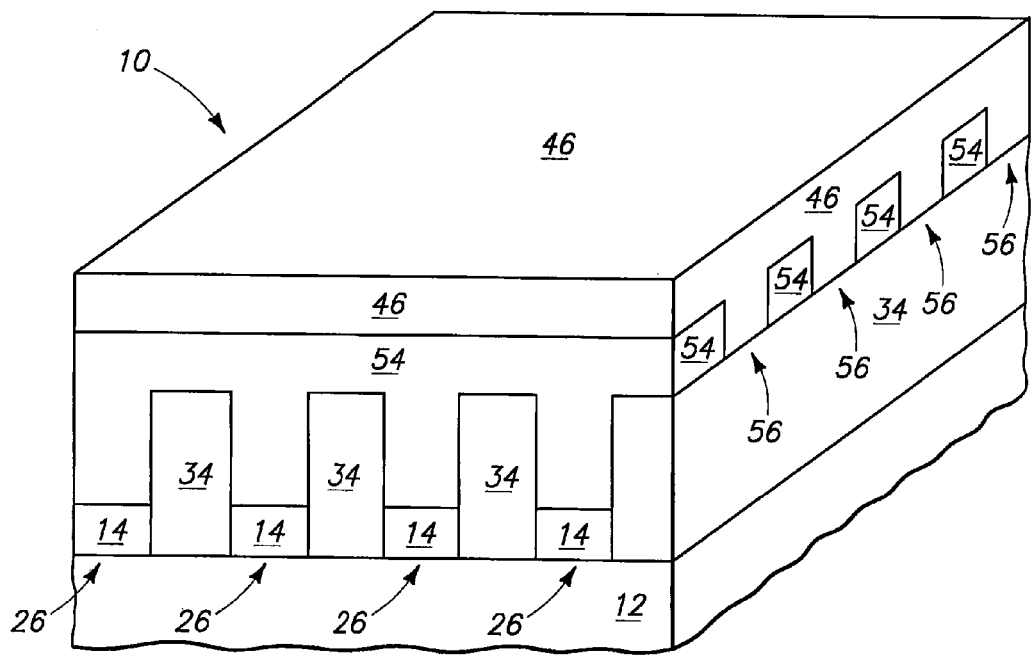
Figure 20:
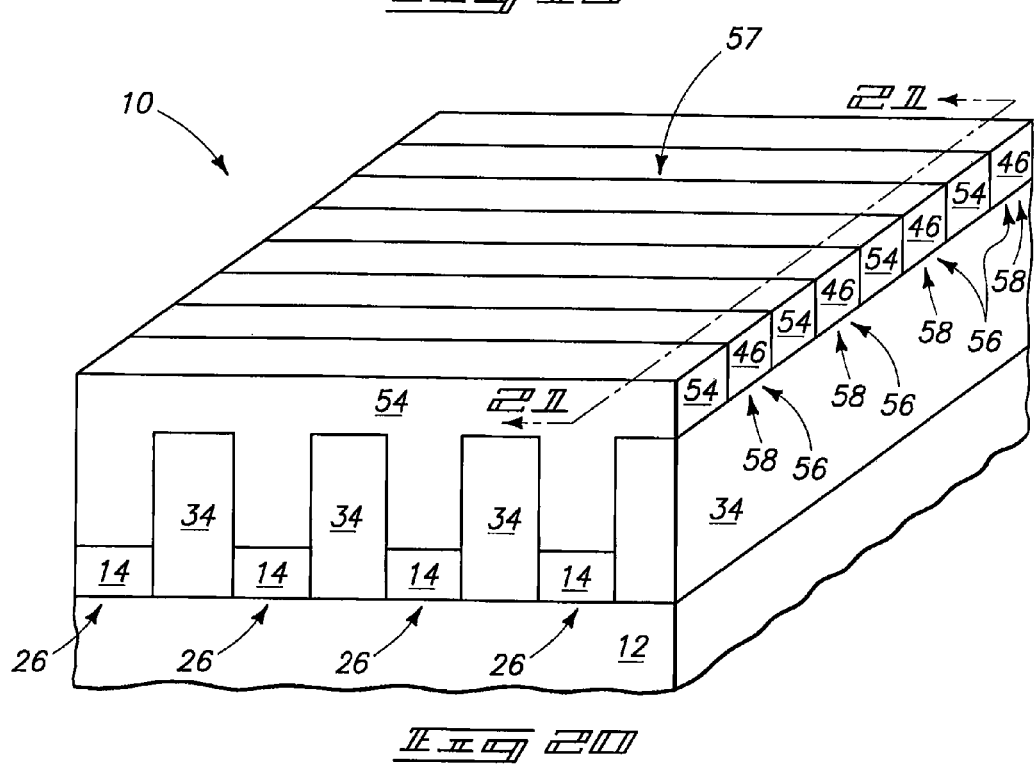

In some embodiments, material 36 is a sacrificial material utilized to define a location for a top electrode material 46 (shown in FIGS. 19 and 20). In other embodiments, material 36 may be a conductive material (i.e., a conductive hard mask), and may be utilized as a top electrode. In embodiments in which material 36 is utilized as a top electrode, material 28 may be removed prior to formation of material 36; and processing discussed below with reference to FIGS. 16-22 may be modified, or omitted. If material 36 is a conductive hard mask material, the material 36 may be considered to be patterned into a plurality of conductive lines 37.

Referring to FIGS. 13 and 14, masking material 38 (FIG. 12) is removed with processing analogous to that discussed above with reference to FIG. 6.

Referring to FIG. 15, a dielectric material 54 is deposited over and between lines 40. Dielectric material 54 may comprise any of the compositions discussed above regarding dielectric material 34. In some embodiments, dielectric material 54 may be a same composition as dielectric material 34; and in other embodiments may be a different composition from dielectric material 34.

Referring to FIG. 16, material 54 is removed from over lines 40. Such removal may be accomplished utilizing any suitable processing. For instance, the removal may be accomplished utilizing an etch-back and/or planarization (for instance, CMP). In the shown embodiment, such removal is accomplished utilizing planarization to form a planarized upper surface 55 extending across materials 36 and 54.

Figure 17:
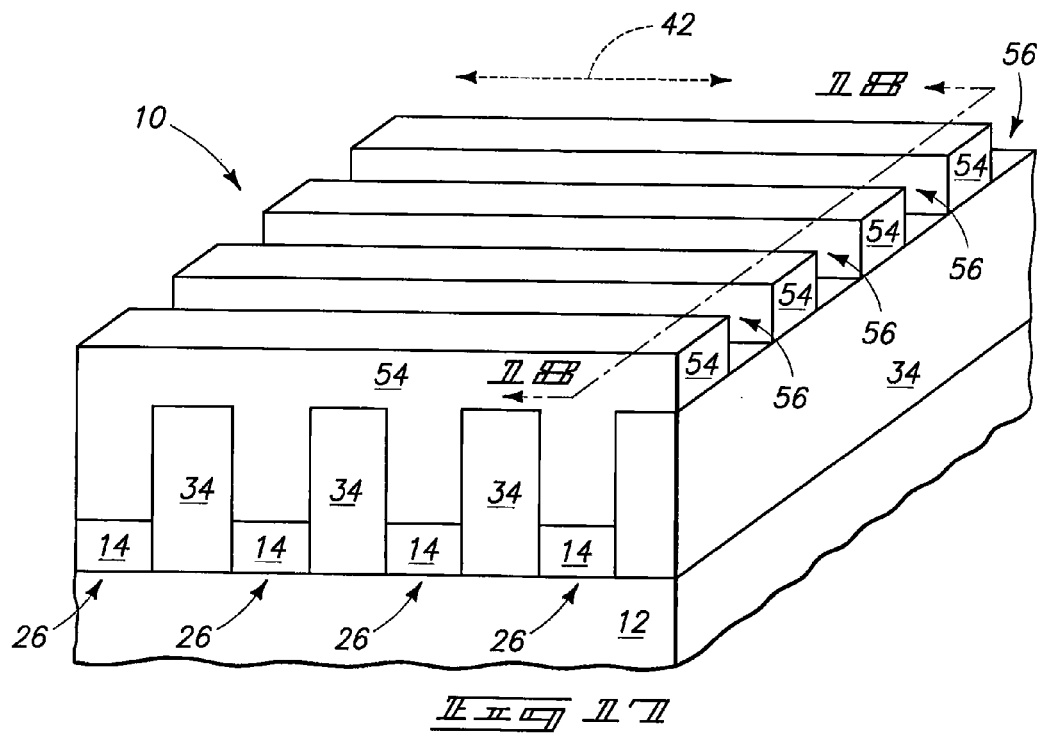

Referring to FIGS. 17 and 18, materials 28 and 36 are removed to leave gaps 56 extending within dielectric materials 34 and 54. The gaps 56 are trenches extending along the second horizontal direction 42.

Referring to FIG. 19, top electrode material 46 is formed over dielectric material 54 and within gaps 56.

Figure 21:
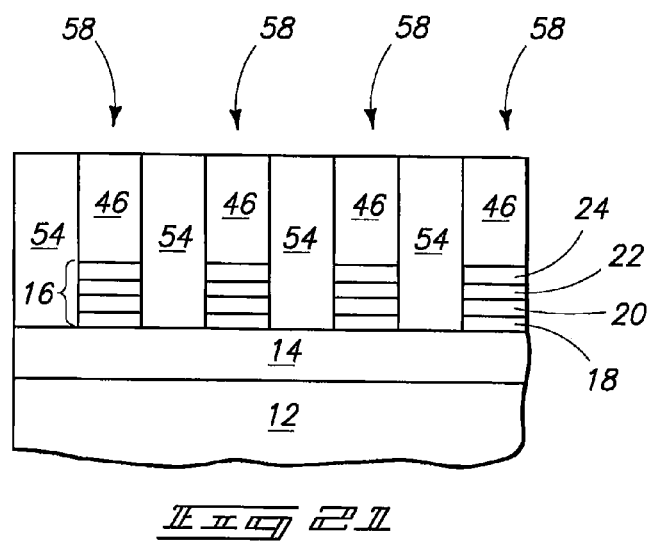
FIG. 21 is a cross-sectional view along the line 21-21 of FIG. 20.

Referring to FIGS. 20 and 21, top electrode material 46 is removed from over dielectric material 54. Such removal may be accomplished utilizing any suitable processing. For instance, the removal may be accomplished utilizing an etch-back and/or planarization (for instance, CMP). In the shown embodiment, such removal is accomplished utilizing planarization to form a planarized upper surface 57 extending across materials 46 and 54.

The top electrode material 46 remaining at the processing stage of FIGS. 20 and 21 is in the form of a plurality of spaced lines 58 formed within the gaps 56 (FIG. 19). A difference between the processing of FIGS. 12-21 and that of FIGS. 5-9 is that the top electrode lines 58 of the processing of FIGS. 12-21 are formed at the locations of masking material 36 (FIG. 16), whereas the top electrode lines 48 of the processing of FIGS. 5-9 are formed within spaces between the locations of masking material 36 (FIG. 8).

Figure 22:
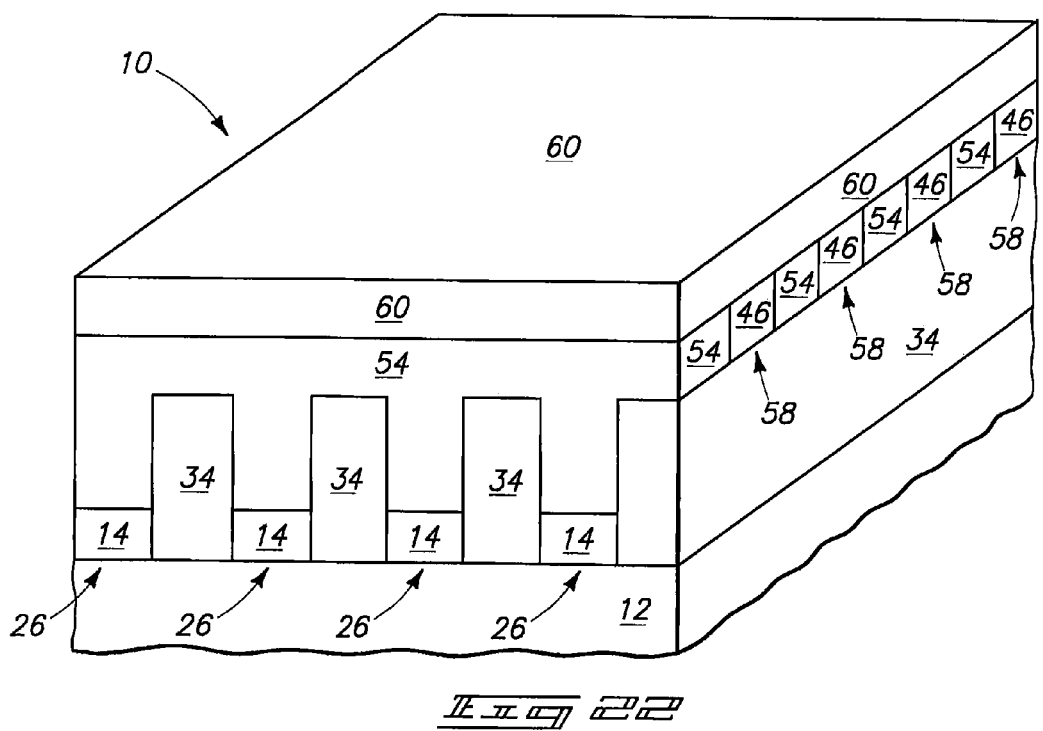

Referring to FIG. 22, a dielectric material 60 is formed over lines 58 of top electrode material 46 as an electrically insulative cap. Dielectric material 60 may comprise any of the compositions discussed above regarding dielectric materials 34 and 54. In some embodiments, dielectric material 60 may be the same composition as at least one of dielectric materials 34 and 54; and in other embodiments dielectric material 60 may be compositionally different from both of materials 34 and 54.

Figure 23:
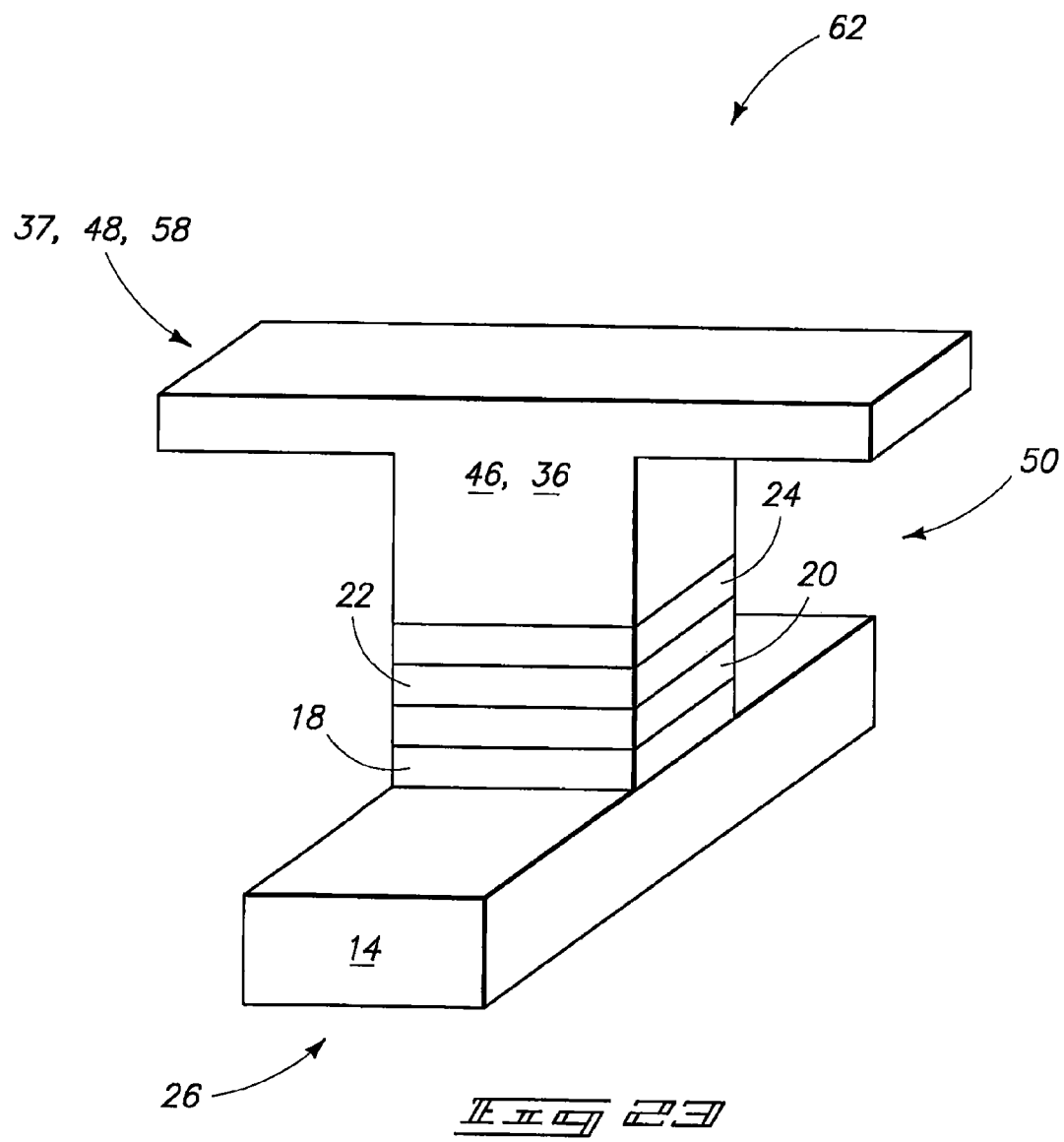
FIG. 23 is a diagrammatic, three-dimensional view of a portion of a construction showing an embodiment of a cross-point memory structure.

Regardless of whether the processing of FIGS. 5-11 is followed, or the processing of FIGS. 12-15 is followed with material 36 being a conductive hard mask utilized as a top electrode, or the processing FIGS. 12-22 is followed with material 36 being a sacrificial material used to define a location of a top electrode, memory arrays will be formed comprising cross-point memory unit cells; with the memory cells having the same configuration from the various processing sequences. An example memory cell structure 62 formed by the processing of FIGS. 5-11, FIGS. 12-15 with material 36 being a conductive hard mask, or that of FIGS. 12-22, is shown in FIG. 23. The memory cell structure includes a line 26 of bottom electrode material 14 extending along a first horizontal direction, and a line 37, 48, 58 of top electrode material 36, 46 extending along a second horizontal direction which is perpendicular to the first horizontal direction. The line of top electrode material will be a line 37 if processing of FIGS. 12-15 is followed with a conductive hard mask material 36, a line 48 of material 46 if the processing of FIGS. 5-11 is followed, and will be a line 58 of material 46 if the processing of FIGS. 12-22 is followed with material 36 being a sacrificial material.

A memory cell 50 is sandwiched between the top and bottom electrodes. The memory cell includes the memory element material 24; and includes materials 18, 20 and 22 as part of an access device configured for accessing data stored within memory element material 24. The shown access device is an MIIM diode, with electrode 14 and electrically conductive material 22 being the outer components of the diode; and with the insulators 18 and 20 being the inner components of the diode.

Another process for forming a memory array is described with reference to FIGS. 24-36. Identical number will be used to describe the embodiment of FIGS. 24-36 as is used above in describing the embodiments of FIGS. 1-23, where appropriate.

Figure 24:
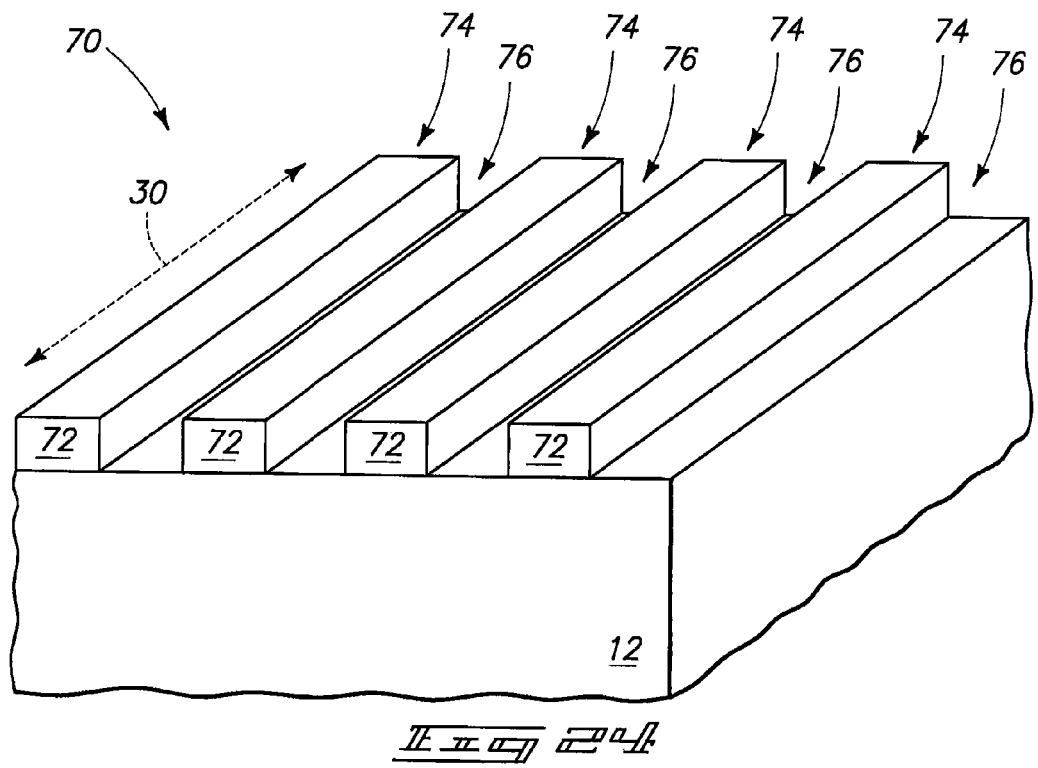

FIG. 24 shows a construction 70 at a processing stage after a patterned masking material 72 has been formed across a base 12. The patterned masking material is in the form of a plurality of spaced lines 74, with such lines extending primarily along the horizontal direction 30. Masking material 72 may comprise any of the compositions described above relative to masking material 28 of FIG. 1.

The spaced lines 74 are separated from one another by gaps 76, which may be referred to as trenches between the lines 74.

The lines 74 of masking material 72 may be formed with any suitable processing. In some embodiments, the lines may be formed by initially forming a layer of material 72 entirely across base 12; forming a photolithographically-patterned mask over the layer of material 72; transferring a pattern from the photolithographically-patterned mask into the underlying material 72 to form the lines 74 of such material; and then removing the photolithographically-patterned mask to leave the construction shown in FIG. 24.

Figure 25:
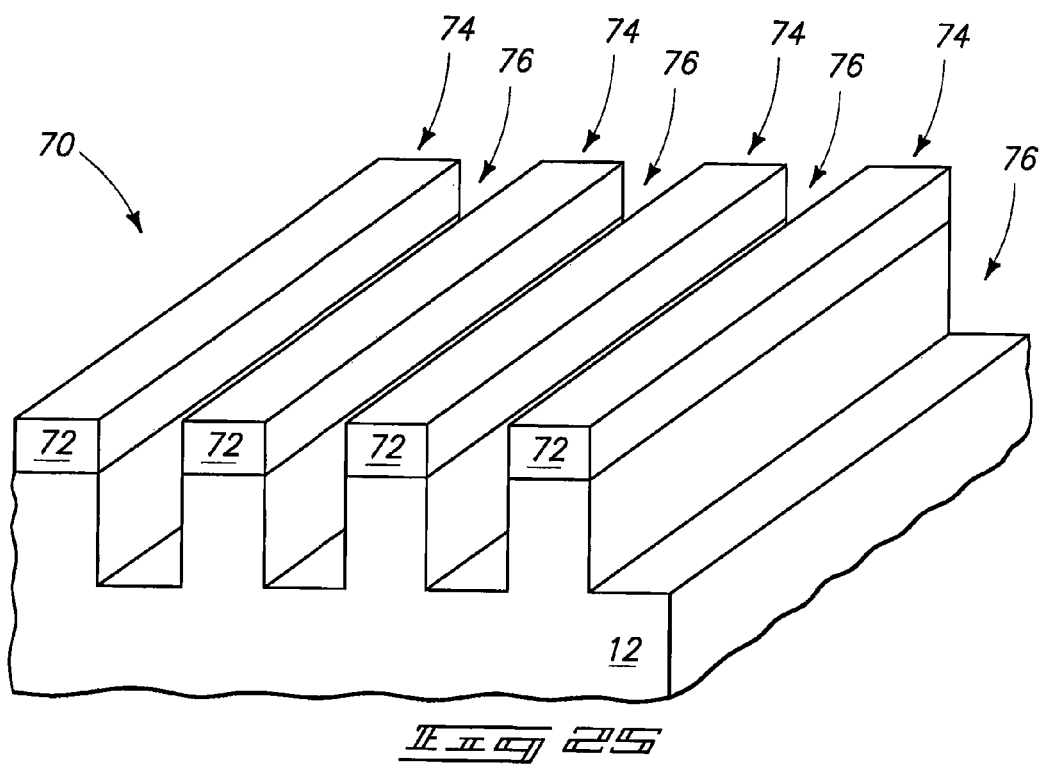

Referring to FIG. 25, a pattern is transferred from patterned masking material 72 into base 12 to extend the trenches 76 into the base.

Referring to FIG. 26, bottom electrode material (or first electrode material) 14 is formed over lines 74 and within the trenches 76 to fill the trenches.

Referring to FIG. 27, bottom electrode material 14 is removed from an upper region of trenches 76, while leaving the bottom electrode material within a lower region of the trenches. The bottom electrode material 14 remaining in the lower region of the trenches forms a plurality of spaced apart lines 77 extending along the first horizontal direction 30. In the shown embodiment, the bottom electrode material fills trenches 76 to a level that is about even with an upper surface of substrate 12. In different embodiments, the bottom electrode material may fill the trenches to a different level; and specifically may fill the trenches to a level beneath an upper surface of base 12 in some embodiments, or may fill the trenches to a level above the upper surface of base 12 in other embodiments. In some embodiments, the bottom electrode material may be a conformal coating, such as, for example, a film formed by atomic layer deposition.

Figure 28:
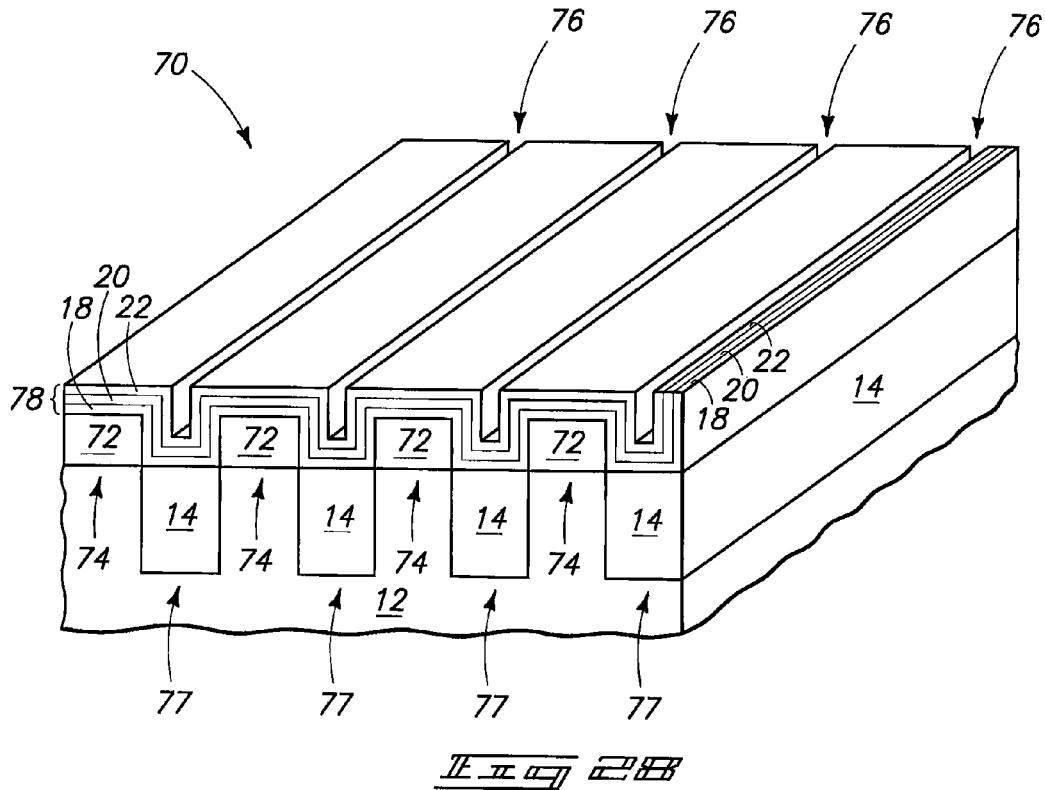

Referring to FIG. 28, a stack 78 of access device materials is formed within the remaining upper regions of the trenches 76 to partially fill such regions of the trenches. The stack 78 includes insulative materials 18 and 20, as well as electrically conductive material 22. Although the access device materials are shown to include a pair of insulative materials, in other embodiments the access device materials may contain more than two insulative materials. In some embodiments, the first insulative material 18 may be native oxide formed along the bottom electrode material.

The access device materials are formed conformally over lines 74 and within trenches 76 so that the stack 78 has an undulating upper topography.

Figure 29:
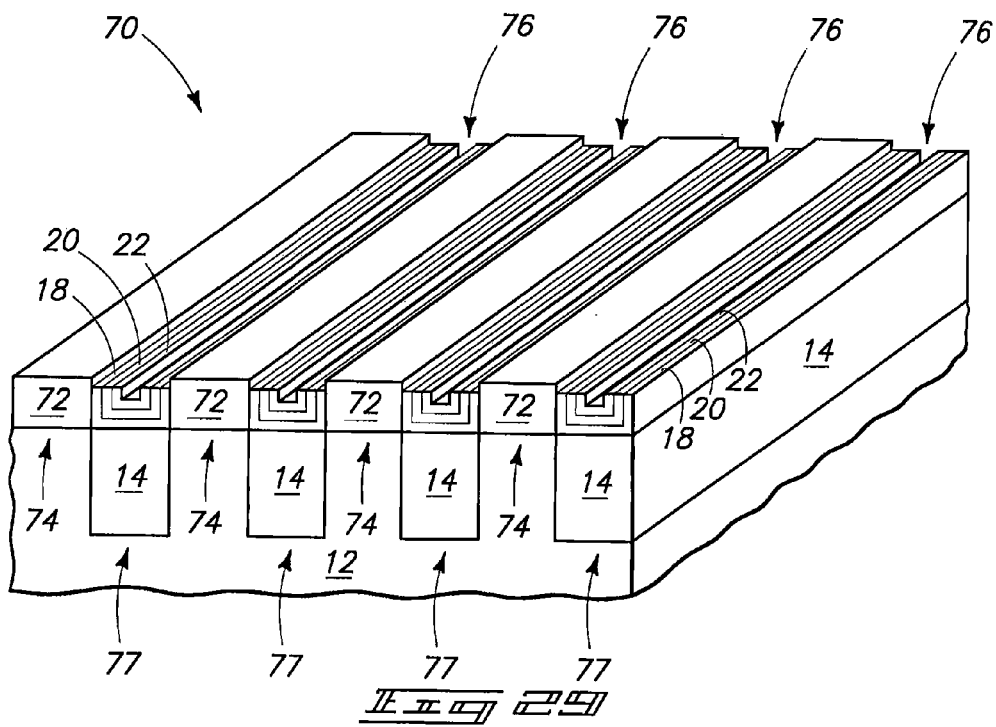

Referring to FIG. 29, the materials 18, 20 and 22 are removed from over lines 74 with etching and/or polishing. If etching is utilized, such etching may comprise a plasma etch. If polishing is utilized, such polishing may comprise CMP.

Figure 49:
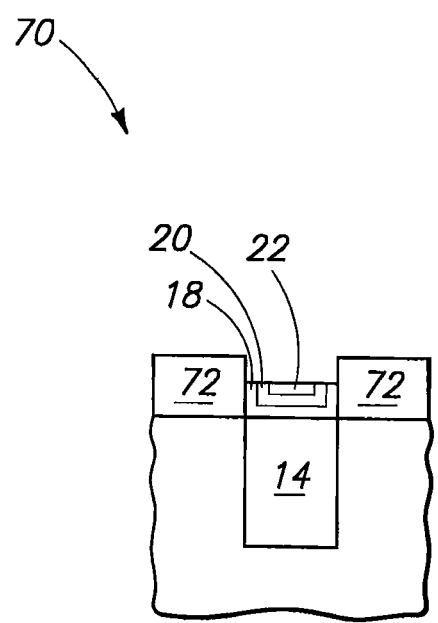
FIG. 49 shows an example plug that may be formed with processing alternative to that shown in FIG. 29.

Electrically conductive material 22 is recessed within trenches 76 so that an upper surface of the electrically conductive material is below the uppermost surfaces of lines 72. In the shown embodiment, all of the materials 18, 20 and 22 are recessed. Such recessing may be accomplished during an etch utilized to remove materials 18, 20 and 22 from over lines 74; or may be accomplished with an etch conducted subsequent to removal of materials 18, 20 and 22 from over lines 74. In some embodiments, the access device materials remaining within the trenches at the processing stage of FIG. 29 may be considered to comprise sidewall regions along sidewalls of the trenches, and to comprise bottom regions along bottoms of the trenches; and the recessing of materials 18, 20 and 22 may be considered to comprise recessing the sidewall regions of the access device materials to a level beneath an upper level of the material 72 along the peripheries of the trenches. In some embodiments, the recessing may be conducted to remove all of materials 18, 20 and 22 from the sidewalls of the opening to leave a block of materials 18, 20 and 22 at the bottoms of the openings, and such blocks may have planarized upper surfaces extending across materials 18, 20 and 22. An example block is shown in FIG. 49.

Figure 30:
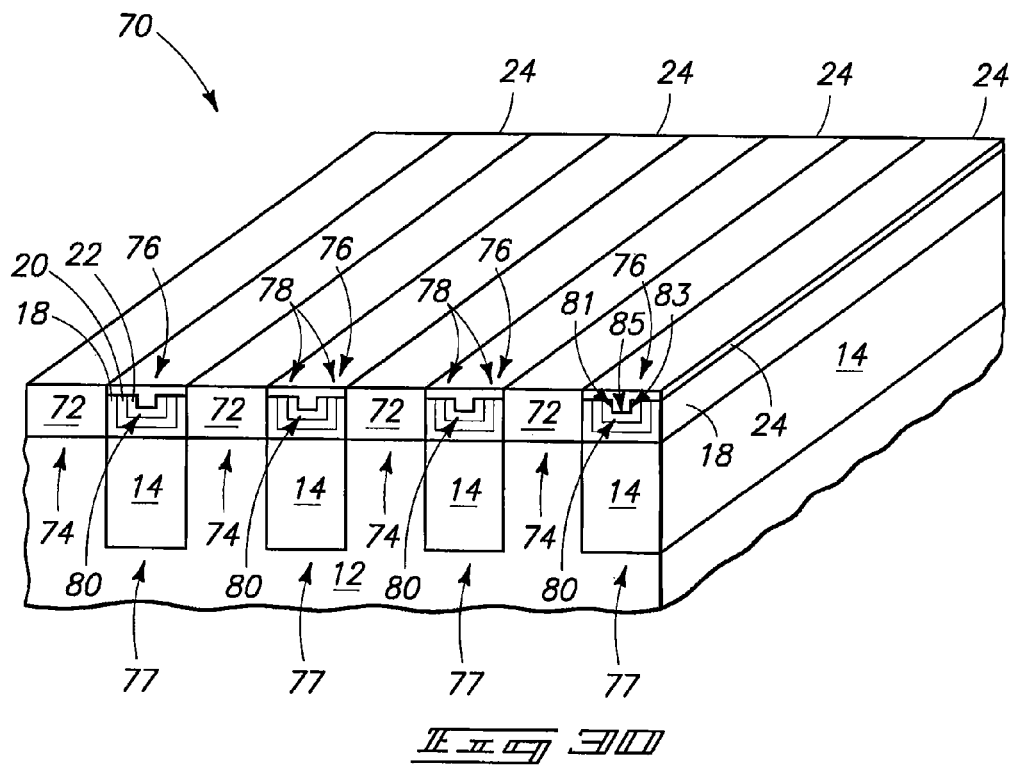

Referring to FIG. 30, memory element material 24 is formed within trenches 76 in a processing stage following that of FIG. 29. The memory element material may be formed in the shown configuration by initially providing the memory element material over lines 74 as well as within the trenches; and then utilizing planarization (for instance, CMP) to remove the memory element material from over the lines, while leaving the memory element material within the trenches. The memory element material remaining within the trenches may be considered to correspond to a plurality of spaced-apart lines that are in one-to-one correspondence with the trenches.

In the shown embodiment, the memory element material within trenches 76 has an upper portion 78 extending across uppermost of materials 18, 20 and 22; and has a plug portion 80 extending downwardly from the upper portion and into a container defined by materials 18, 20 and 22. The plug portion has downwardly-extending sidewalls 81 and 83, and has a bottom 85 joined to the downwardly-extending sidewalls. The conductive material 22 extends along both of the downwardly-extending sidewalls 83 of the plugs, as well as along the bottoms 85 of such plugs.

Figure 31:
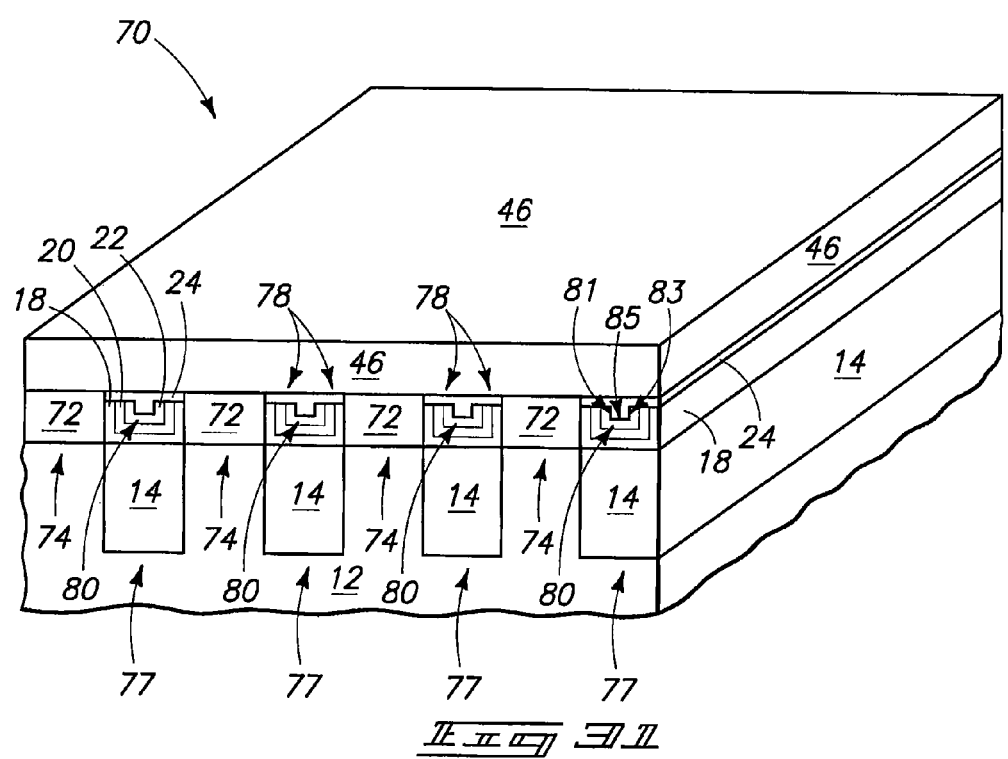

Referring to FIG. 31, top electrode material (or second electrode material) is formed over memory element material 24, and over material 72 of lines 74.

Referring to FIG. 32, masking material 36 is formed over top electrode material 46, and patterned masking material 38 is formed over material 36. Material 38 may correspond to photolithographically-patterned photoresist, and is formed in the pattern of the plurality of spaced-apart lines 40 analogous to that which was discussed above with reference to FIG. 5. The lines 40 extend along the second horizontal direction 42 which is orthogonal to the first horizontal direction 30.

The lines 40 are spaced from one another by gaps 44.

Referring to FIG. 33, a pattern is transferred from material 38 (FIG. 32) through underlying materials 72, 18, 20, 22, 24, 36 and 46, to pattern such underlying materials into the configuration of the plurality of lines 40 extending along the horizontal direction 42; and then masking material 38 is removed. Such patterning may comprise transferring a pattern from masking material 38 into hard mask 36, removal of masking material 38, and then transfer of the pattern from hard mask 36 into the underlying materials 72, 18, 20, 22, 24 and 46 with one or more suitable etches. The patterning forms the top electrode material 46 into a plurality of electrode lines 48, with such electrode lines 48 being part of the lines 40.

Referring to FIG. 34, masking material 36 is removed. Such removal may be accomplished with an etch, CMP, and/or a wet clean.

Referring to FIG. 35, dielectric material 90 is formed over top electrode lines 48 and within the gaps 44 between such lines. Dielectric material 90 may comprise any of the compositions discussed above with reference to dielectric material 34 of FIG. 3.

Although material 36 (FIG. 33) is removed prior to formation of dielectric material 90 in the shown embodiment, in other embodiments material 36 may remain at the processing stage of FIG. 35.

Figure 36:
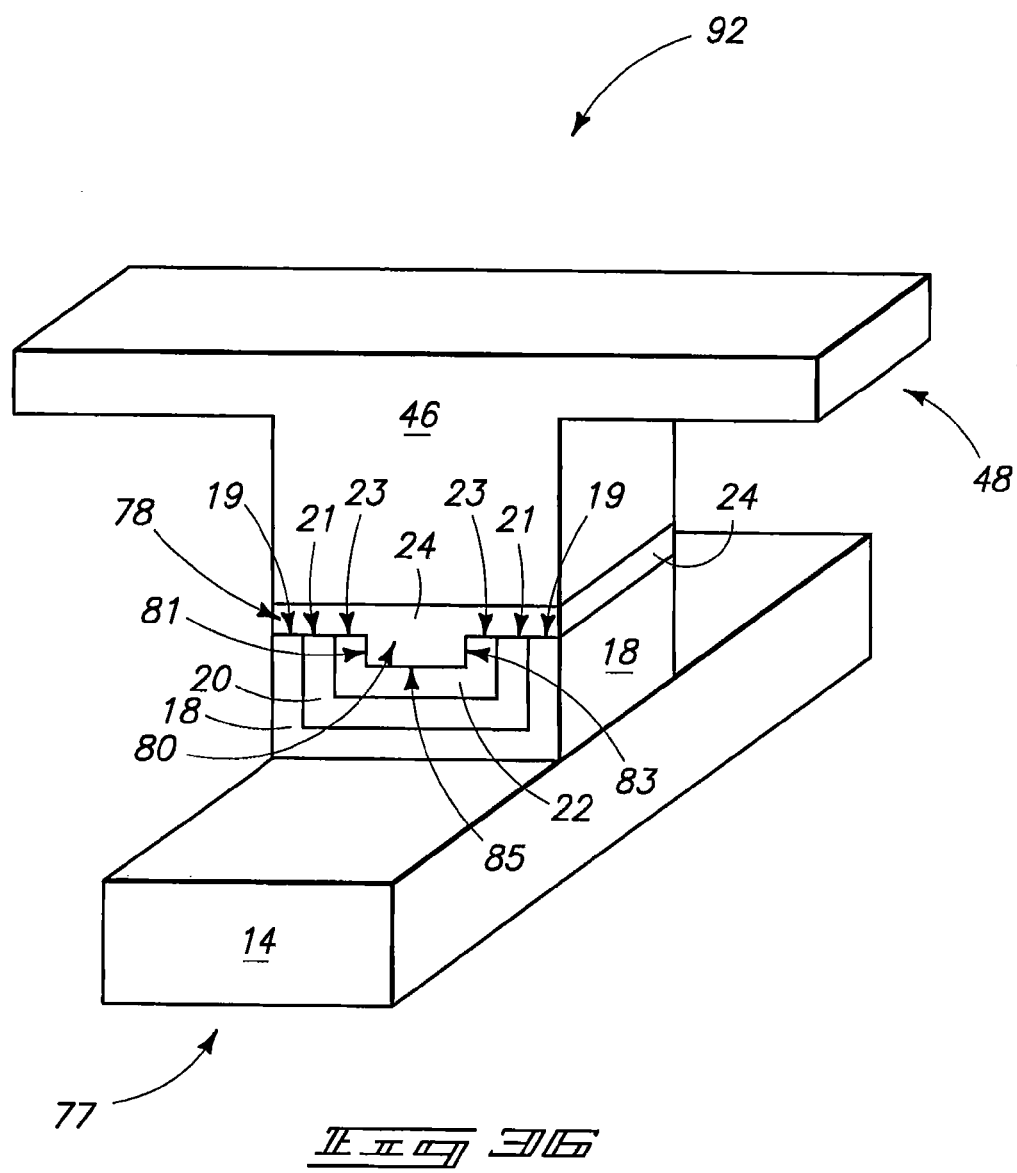
FIG. 36 is a diagrammatic, three-dimensional view of a portion of a construction showing another embodiment of a cross-point memory structure.

The construction of FIG. 35 comprises a memory array which includes a plurality of cross-point memory structures. An example of the memory structures is shown in FIG. 36 as a structure 92.

The memory cell structure includes a line 77 of bottom electrode material 14 extending along a first horizontal direction, and a line 48 of top electrode material 46 extending along a second horizontal direction which is perpendicular to the first horizontal direction.

The memory cell structure also includes the memory element material 24, the insulative materials 18 and 20, and the electrically conductive material 22. The materials 18, 20 and 22 are part of an access device configured for accessing data stored within memory element material 24. The access device is an MIIM diode, with electrode 14 and electrically conductive material 22 being the outer components of the diode; and with the insulators 18 and 20 being the inner components of the diode.

In the shown embodiment, the memory element material 24 includes the upper portion 78 extending across uppermost of materials 18, 20 and 22; and the plug portion 80 extending downwardly from the upper portion and into a container defined by materials 18, 20 and 22. The plug portion has the downwardly-extending sidewalls 81 and 83, and has the bottom 85 joined to the downwardly-extending sidewalls. The conductive material 22 extends along both of the downwardly-extending sidewalls 83 of the plug, as well as along the bottom 85 of such plug.

The materials 18, 20 and 22 may be together considered to correspond to diode material. In some embodiments, the materials 18, 20 and 22 are components of an access device utilized for accessing data stored in the memory element. Accordingly, the embodiment of FIG. 36 may be considered to comprise a multi-sided container of access device materials (with such multi-sided container specifically comprising two sides in the embodiment of FIG. 36); and to comprise the plug 80 of memory element material extending into such multi-sided container.

In the shown embodiment, memory element material 24 has an uppermost region 78 that extends across uppermost surfaces of all of the materials 18, 20 and 22 (with such uppermost surfaces being labeled 19, 21 and 23 in FIG. 36). However, as discussed above with reference to FIG. 29, the invention may include embodiments in which material 22 is recessed within a trench, without recessing one or both of the materials 18 and 20. In such embodiments, the upper portion 78 of memory element material 24 would not extend over the upper surface of the materials which were not recessed within the trench, and accordingly may be over an uppermost surface of electrically conductive material 22 while not being over uppermost surfaces of one or both of materials 18 and 20. If the processing of FIG. 49 is utilized instead of that of FIG. 29, a memory cell analogous to the structure 92 may be formed, but with a different configuration of materials 18, 20, 22 and 24.

Another process for forming a memory array is described with reference to FIGS. 37-48. Identical number will be used to describe the embodiment of FIGS. 37-48 as is used above in describing the embodiments of FIGS. 1-36, where appropriate.

FIG. 37 shows a construction 100 at a processing stage identical to that discussed above with reference to FIG. 24. Accordingly, the patterned masking material 72 has been formed across a base 12. The patterned masking material is in the form of a plurality of spaced apart lines 74, with such lines extending primarily along the horizontal direction 30. The spaced apart lines 74 are separated from one another by gaps 76, which may be referred to as trenches between the lines 74.

Referring to FIG. 38, construction 100 is shown at a processing stage identical to that discussed above with reference to FIG. 25. Accordingly, a pattern has been transferred from patterned masking material 72 into base 12 to extend the trenches 76 into the base.

Figure 39:
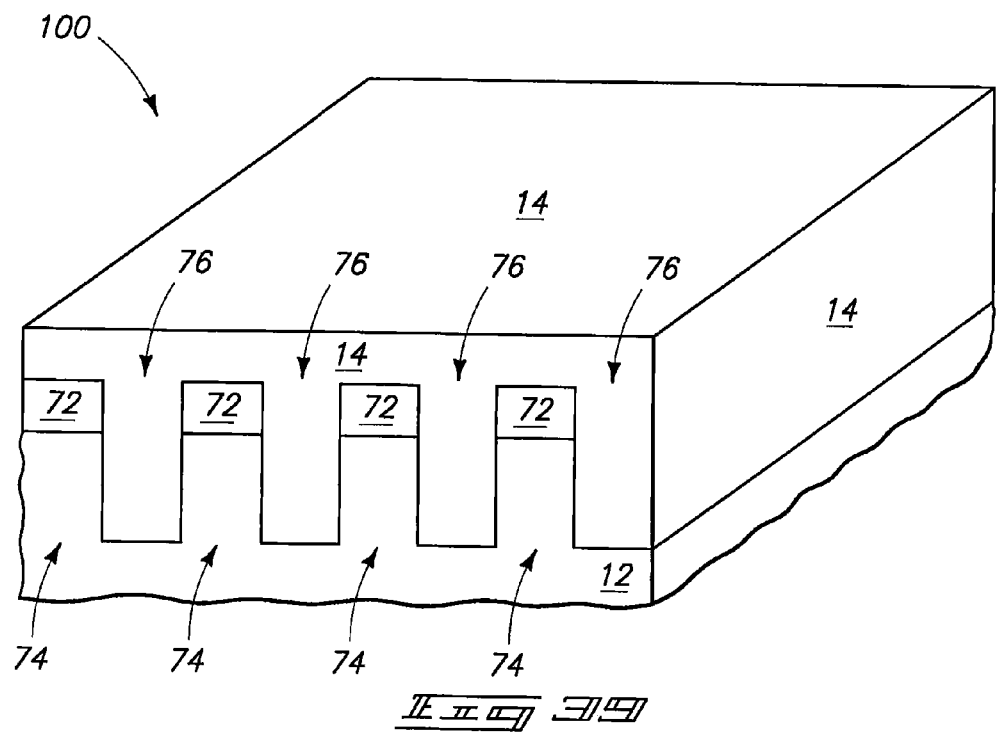

Referring to FIG. 39, construction 100 is shown at a processing stage identical to that discussed above with reference to FIG. 26. Accordingly, bottom electrode material (or first electrode material) 14 is formed over lines 74 and within the trenches 76 to fill the trenches.

Figure 40:
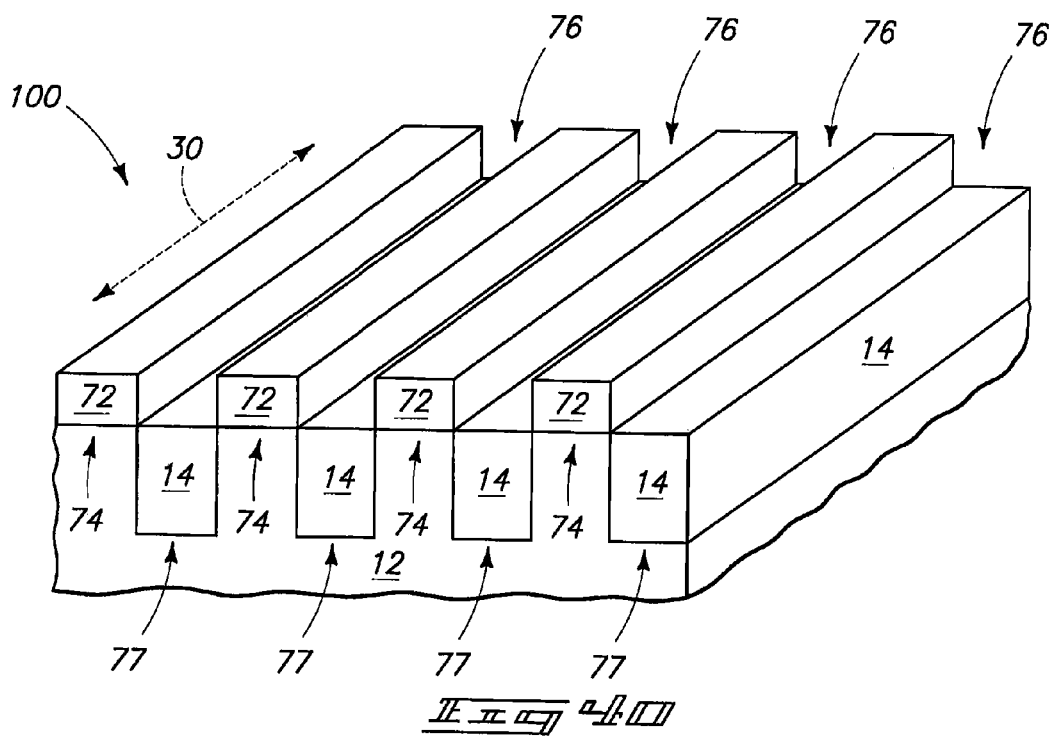

Referring to FIG. 40, construction 100 is shown at a processing stage identical to that discussed above with reference to FIG. 27. Accordingly, bottom electrode material 14 is removed from an upper region of trenches 76, while leaving the bottom electrode material within a lower region of the trenches. The bottom electrode material 14 remaining in the lower region of the trenches forms the plurality of spaced apart lines 77 extending along the first horizontal direction 30.

Referring to FIG. 41, an etch stop layer 102 is formed over lines 74 and within trenches 76. The etch stop material may comprise any suitable composition or combination of compositions; and may, for example, comprise, consist essentially of, or consist of silicon dioxide, silicon nitride or silicon oxynitride.

Referring to FIG. 42, material 102 is removed from over material 72 with one or both of etching and polishing. In the shown embodiment, material 102 has been removed with CMP to leave a planarized surface 103 extending across materials 72 and 102.

Referring to FIG. 43, a masking material 104 is formed over surface 103, and patterned masking material 106 is formed over material 104. Material 106 may correspond to photolithographically-patterned photoresist, and is formed in a pattern of a plurality of spaced-apart lines 108 extending along the second horizontal direction 42 which is orthogonal to the first horizontal direction 30.

The lines 108 are spaced from one another by gaps 110.

Material 104 may comprise any of the compositions discussed above relative to material 28 of FIG. 1. Material 104 may be of a common composition to material 72 in some embodiments, and may be compositionally different from material 72 in other embodiments.

Referring to FIG. 44, a pattern is transferred from material 106 (FIG. 43) through underlying material 104 to pattern such underlying material into the configuration of the plurality of lines 108 extending along the horizontal direction 42; and then masking material 106 is removed. Such patterning may be considered to comprise extending gaps 110 into material 104.

Some of the material 102 is exposed within the gaps 110. FIG. 45 shows construction 100 after the exposed portions of material 102 have been removed. Such removal creates openings 112 (only some of which are labeled) that extend to an upper surface of the bottom electrode material 14. As discussed above with reference to FIG. 40, the lines 74 of material 72 may be considered to be spaced from one another by trenches (or gaps) 76 (shown in FIG. 40). Similarly, the lines 108 of material 104 may be considered to be spaced from one another by gaps 110. Accordingly, the openings 112 may be considered to correspond to locations where gaps 110 overlap gaps 76 (shown in FIG. 40).

The openings 112 may be considered to be examples of polygonal openings, and in the shown embodiment are four-sided openings.

The openings 112 are in a many-to-one arrangement with the lines 77 of bottom electrode material 14. In other words, there are many openings 112 along each of the individual lines.

Referring to FIG. 46, a stack 78 of access device material is formed over materials 72 and 104, and within the openings 112. The stack 78 only partially fills the openings 112. The stack 78 includes insulative materials 18 and 20, as well as electrically conductive material 22. Although the stack 78 is shown to include a pair of insulative materials, in other embodiments the stack 78 may contain more than two insulative materials. In some embodiments, the insulative material 18 may correspond to native oxide grown over the bottom electrode. The drawing of FIG. 46 is somewhat confusing in that the materials 18, 20 and 22 along the rightmost edge of the drawing join two different planes to one another. A dashed line 105 is provided to indicate where the view of the materials 18, 20 and 22 along the rightmost edges changes from one plane to another. Also, there is an illusion along the rightmost edge that appears to show gaps 110 pinched relative to openings 112. Such illusion results from the direction along the cross-section of the rightmost edge, and in actual practice the gaps 110 may correspond identically to the widths along one side of the openings 112.

Referring to FIG. 47, the materials 104, 18, 20 and 22 are removed from over materials 72 and 102 with etching and/or polishing. If etching is utilized, such etching may comprise a plasma etch. If polishing is utilized, such polishing may comprise CMP. The removal of materials 104, 18, 20 and 22 from over materials 72 and 102 leaves the materials 18, 20 and 22 only within openings 112, and leaves the openings 112 laterally bounded by materials 72 and 102. Materials 72 and 102 are different from one another so that material 102 could be selectively removed relative to material 72 at the processing stage of FIG. 45. Thus, the openings 112 at the processing stage of FIG. 47 may be considered to bounded by two types of material (with one of the materials corresponding to material 72, and the other corresponding to material 102). Two of the four sides of the openings 112 will be laterally bounded by one of said two types of material, and the other two of the four sides will be laterally bounded by the other of said two types of material.

Electrically conductive material 22 is recessed within openings 112 so that an upper surface of the electrically conductive material is below the uppermost surfaces of materials 72 and 102. In the shown embodiment, all of the materials 18, 20 and 22 are recessed. Such recessing may be accomplished during an etch utilized to remove materials 18, 20 and 22 from over materials 72 and 102; or may be encompassed with an etch conducted subsequent to removal of materials 18, 20 and 22 from over materials 72 and 102. In some embodiments, the access device material remaining within the openings 112 at the processing stage of FIG. 47 may be considered to comprise sidewall regions along sidewalls of the openings 112, and to comprise bottom regions along bottoms of the openings; and the recessing of access device materials 18, 20 and 22 may be considered to comprise recessing the sidewall regions of the access device materials to a level beneath an upper level of the materials 72 and 102 along the peripheries of openings 112. In some embodiments, the recessing may remove all of materials 18, 20 and 22 from along the sidewalls, analogously to the processing discussed above with reference to FIG. 49.

Referring to FIG. 48, memory element material 24 is formed within openings 112 and over materials 72 and 102.

In the shown embodiment, the memory element material within openings 112 has plug portions 114 extending downwardly into containers defined by materials 18, 20 and 22. The plug portions have four downwardly-extending sidewalls analogous to the sidewalls 81 and 83 of FIG. 36 (with such plug portions of the embodiment of FIG. 48 being defined by the four sides of the containers formed by materials 18, 20 and 22 within openings 112, with such containers being visible in the top view of FIG. 47), and have bottoms joined to the downwardly-extending sidewalls. The conductive material 22 extends along the downwardly-extending sidewalls of the plug portions, as well as along the bottoms of such plug portions.

In subsequent processing (not shown), the memory element material may be subjected to planarization (for instance, CMP) to remove the memory element material from over the materials 72 and 102, while leaving the memory element material within the openings 112. Top electrode material analogous to the electrode material 46 of FIG. 31 may be then be formed over memory element material, and patterned to form a plurality of top electrode lines analogous to the lines 48 of FIG. 34. Such patterning may utilize processing analogous to that discussed above with reference to FIGS. 31-35. The construction 100 of FIG. 48 may thus be utilized to form memory cell structures analogous to the structure of FIG. 36, but where a plug portion of a memory element material is within a four-sided container of access device material, rather than within a two-sided container of the access device material. The two-sided and four-sided containers of FIGS. 36 and 48 are examples of multi-sided containers that may be formed in some embodiments of the invention. The number of sides of multi-sided openings may be varied in other embodiments (not shown), and the lengths of the sides may be varied, so that the multi-sided containers may have more than four sides. In some embodiments, there may be so many sides that the multi-sided containers are substantially cylindrical.

It may be advantageous for the conductive material 22 of an access diode to wrap at least partially around the memory element material of a cross-point memory cell to improve coupling between the diode and the memory element material. Accordingly, the wrapping access structures formed in accordance with the embodiments of FIGS. 24-48 (for instance, the structure shown in FIG. 36) may have some advantages relative to the planar diode structures formed by the embodiment of FIGS. 1-23 (with such planar structures being shown in FIG. 23). However, the embodiment of FIGS. 1-23 may have an advantage in some applications in that the processing of the embodiment of FIGS. 1-23 may be simpler than the processing of the embodiments of FIGS. 24-48.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A cross-point memory structure, comprising:
    a line of first electrode material extending along a first direction across a silicon-containing semiconductor substrate; the first electrode material comprising one or more of platinum, titanium nitride and tantalum nitride;
    a multi-sided container of access device materials over the first electrode material, the access device materials including an electrically conductive metal-containing material and at least two insulative materials, the insulative materials being between the electrically conductive metal-containing material and the first electrode material;
    memory element material within the multi-sided container; and
    a line of second electrode material over the memory element material and extending along a second direction that intersects the first direction of the line of first electrode material.

2. The cross-point memory structure of claim 1 wherein the memory element material extends outwardly of the container.

3. The cross-point memory structure of claim 1 wherein the multi-sided container is a two-sided container.

4. The cross-point memory structure of claim 1 wherein the multi-sided container is a four-sided container.

5. The cross-point memory structure of claim 4 wherein the four-sided container is within a four-sided opening laterally bounded by two types of material, wherein two of the four sides of the opening are laterally bounded by one of the two types of material, and wherein another two of the four sides of the opening are laterally bounded by another of the two types of material.

6. The cross-point memory structure of claim 1 wherein:
    the first electrode material has a low work function relative to the electrically conductive metal-containing material, and
    the electrically conductive metal-containing material comprises one or more compositions selected from the group consisting of tantalum silicon nitride, chromium and tantalum.

7. A cross-point memory structure, comprising:
    a first electrode material structure over a semiconductor substrate;
    a multi-sided container of access device materials over the first electrode material structure, the access device materials including an electrically conductive metal-containing material and at least two insulative materials, the insulative materials being between the electrically conductive metal-containing material and the first electrode material;
    memory element material withi the multi-sided container;
    a second electrode material structure over the memory element material; and
    wherein the first and second electrode material structures are composed by intersecting line structures.

8. The cross-point memory structure of claim 7 wherein the multi-sided container is a four-sided container.

9. The cross-point memory structure of claim 8 wherein the four-sided container is within a four-sided opening laterally bounded by two types of material, wherein two of the four sides of the opening are laterally bounded by one of the two types of material, and wherein another two of the four sides of the opeing are laterally bounded by another of the two types of material.

10. A cross-point memory structure, comprising:
    a line of first electrode material extending along a first horizontal direction;
    a multi-sided container of access device materials over the first electrode material, the access device materials including an electrically conductive metal-containing material and at least two insulative materials, the insulative materials being between the electrically conductive metal-containing material and the first electrode material;
    memory element material within the multi-sided container; wherein the memory element material includes a plug portion within the multi-sided container; wherein the electrically conductive metal-containing material extends along downwardly-extending sidewalls of the plug portion as well as along a bottom of the plug portion; and
    a line of second electrode material over the memory element material and extending along a second horizontal direction that is orthogonal to the first horizontal direction of the line of first electrode material.

* * * * *

UNITED STATES PATENT AND TRADEMARK OFFICE
CERTIFICATE OF CORRECTION

PATENT NO. : 8,530,939 B2
APPLICATION NO. : 13/484944
DATED : September 10, 2013
INVENTOR(S) : Scott Sills et al.

Page 1 of 1

It is certified that error appears in the above-identified patent and that said Letters Patent is hereby corrected as shown below:

In the Claims

In column 14, line 24, in Claim 7, delete "withi" and insert -- within --, therefor.

In column 14, line 28, in Claim 7, delete "composed" and insert -- comprised --, therefor.

In column 14, line 36, in Claim 9, delete "opeing" and insert -- opening --, therefor.

Signed and Sealed this
Twenty-sixth Day of November, 2013

Margaret A. Focarino
*Commissioner for Patents of the United States Patent and Trademark Office*